(12) United States Patent
Suehiro et al.

(10) Patent No.: US 7,607,801 B2
(45) Date of Patent: Oct. 27, 2009

(54) LIGHT EMITTING APPARATUS

(75) Inventors: Yoshinobu Suehiro, Aichi-ken (JP); Satoshi Wada, Aichi-ken (JP); Akihito Ota, Aichi-ken (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 41 days.

(21) Appl. No.: 10/521,943

(22) PCT Filed: Oct. 28, 2004

(86) PCT No.: PCT/JP2004/016364

§ 371 (c)(1),
(2), (4) Date: Apr. 11, 2005

(87) PCT Pub. No.: WO2005/043637

PCT Pub. Date: May 12, 2005

(65) Prior Publication Data

US 2006/0164836 A1    Jul. 27, 2006

(30) Foreign Application Priority Data

Oct. 31, 2003    (JP) .......................... 2003-373274
Aug. 30, 2004    (JP) .......................... 2004-251021

(51) Int. Cl.
*F21V 29/00* (2006.01)
*F21V 7/20* (2006.01)
*F21V 7/00* (2006.01)
*B60Q 1/06* (2006.01)
*B60Q 1/00* (2006.01)

(52) U.S. Cl. ............... 362/294; 362/547; 362/345; 362/373; 362/298; 362/346

(58) Field of Classification Search .......... 362/294, 362/298, 580, 547, 126, 218, 373, 264, 345, 362/346
See application file for complete search history.

(56) References Cited

U.S. PATENT DOCUMENTS 5,472,915 A * 12/1995 Schairer et al. ............... 438/25
5,924,785 A *  7/1999 Zhang et al. ................ 362/241

(Continued)

FOREIGN PATENT DOCUMENTS

JP    5-291627    11/1993

(Continued)

OTHER PUBLICATIONS

Notification of Reasons for Refusal dated Feb. 7, 2007 with partial English translation.
Chinese Office Action dated Jan. 4, 2008, with English translation.

*Primary Examiner*—Jong-Suk (James) Lee
*Assistant Examiner*—David J Makiya
(74) *Attorney, Agent, or Firm*—McGinn IP Law Group, PLLC

(57) ABSTRACT

A reflection-type light emitting apparatus has an excellent heat radiation property and allows the use of a high-power light emitting element, the minimization of a reduction in radiation efficiency of reflected light, and the focused radiation of high-output light at high efficiency. The apparatus has: a case 10 of metallic material and with an excellent heat radiation property; a reflection mirror section 11 formed fitted to the lower portion of case 10; a transparent plate 12 to cover the upper surface of case 10; heat radiation plates 13, 14 of metallic material with excellent heat conductivity and inserted inside the case 10; an LED element 2 mounted on the heat radiation plate 13; lead sections 15A, 15B fixed through an insulating layer 15a to the heat radiation plate 13 to serve as a power supply member to supply power to the LED element 2; and a spacer 16 of an insulating material to insulate the lead sections 15A, 15B from the case 10.

29 Claims, 16 Drawing Sheets

U.S. PATENT DOCUMENTS

| | | | | |
|---|---|---|---|---|
| 5,959,316 | A * | 9/1999 | Lowery | 257/98 |
| 6,076,948 | A * | 6/2000 | Bukosky et al. | 362/494 |
| 6,439,888 | B1 * | 8/2002 | Boutoussov et al. | 433/215 |
| 6,578,998 | B2 * | 6/2003 | Zhang | 362/555 |
| 6,672,741 | B1 * | 1/2004 | Young | 362/311 |
| 6,733,156 | B2 * | 5/2004 | Chen | 362/245 |
| 6,784,463 | B2 * | 8/2004 | Camras et al. | 257/99 |
| 6,800,373 | B2 * | 10/2004 | Gorczyca | 428/447 |
| 6,851,835 | B2 * | 2/2005 | Smith et al. | 362/305 |
| 6,871,993 | B2 * | 3/2005 | Hecht | 362/555 |
| 6,874,910 | B2 * | 4/2005 | Sugimoto et al. | 362/294 |
| 6,976,769 | B2 * | 12/2005 | McCullough et al. | 362/345 |
| 6,999,318 | B2 * | 2/2006 | Newby | 361/719 |
| 7,001,047 | B2 * | 2/2006 | Holder et al. | 362/296 |
| 7,086,765 | B2 * | 8/2006 | Wehner | 362/511 |
| 7,131,760 | B2 * | 11/2006 | Mayer et al. | 362/555 |
| 7,246,921 | B2 * | 7/2007 | Jacobson et al. | 362/294 |
| 7,281,823 | B2 * | 10/2007 | Moisel | 362/294 |
| 7,422,349 | B2 * | 9/2008 | Wada et al. | 362/373 |
| 2002/0024808 | A1 * | 2/2002 | Suehiro et al. | 362/245 |
| 2004/0252502 | A1 * | 12/2004 | McCullough et al. | 362/241 |
| 2005/0168994 | A1 * | 8/2005 | Jacobson et al. | 362/311 |
| 2006/0245201 | A1 * | 11/2006 | Wada et al. | 362/545 |
| 2007/0279910 | A1 * | 12/2007 | Lin | 362/298 |

FOREIGN PATENT DOCUMENTS

| | | |
|---|---|---|
| JP | 10-144966 | 5/1998 |
| JP | 10-335706 | 12/1998 |
| JP | 2000-503131 | 3/2000 |
| JP | 2000-252525 | 9/2000 |
| JP | 2001-189494 | 7/2001 |
| JP | 2001-217466 | 8/2001 |
| JP | 2002-111068 | 4/2002 |
| JP | 2002-111070 | 4/2002 |
| JP | 2002-124704 | 4/2002 |
| JP | 2002-151746 | 5/2002 |
| JP | 2002-223006 | 8/2002 |
| JP | 2002-314137 | 10/2002 |
| JP | 2003-8079 | 1/2003 |
| JP | 2003-17752 | 1/2003 |
| WO | WO 97/24770 | 7/2007 |

\* cited by examiner

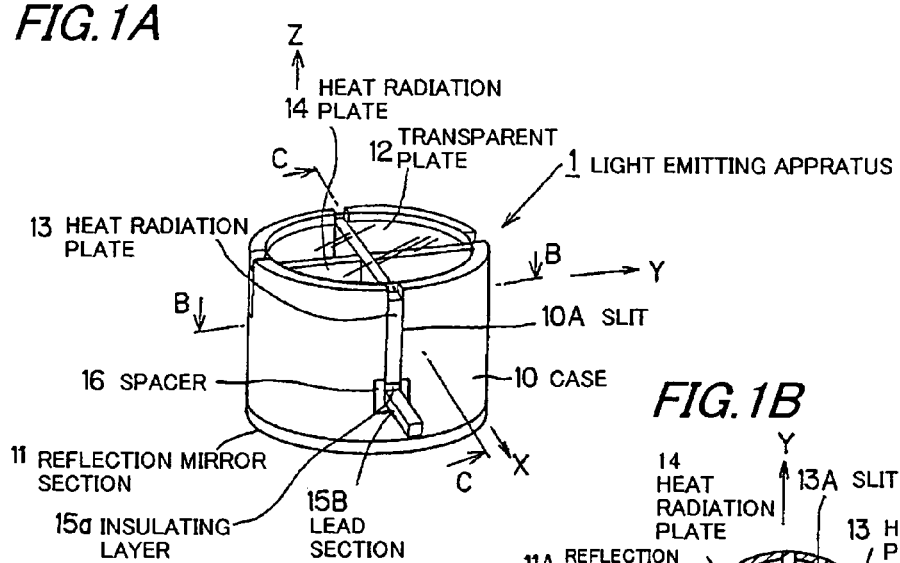
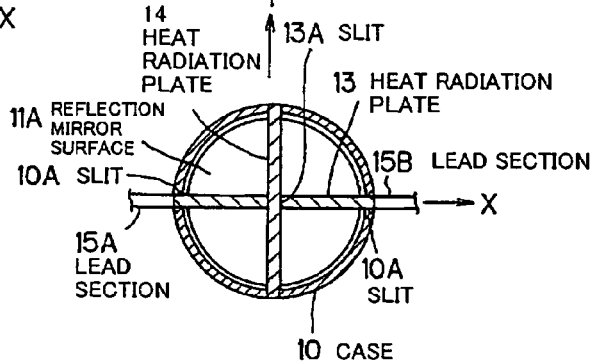
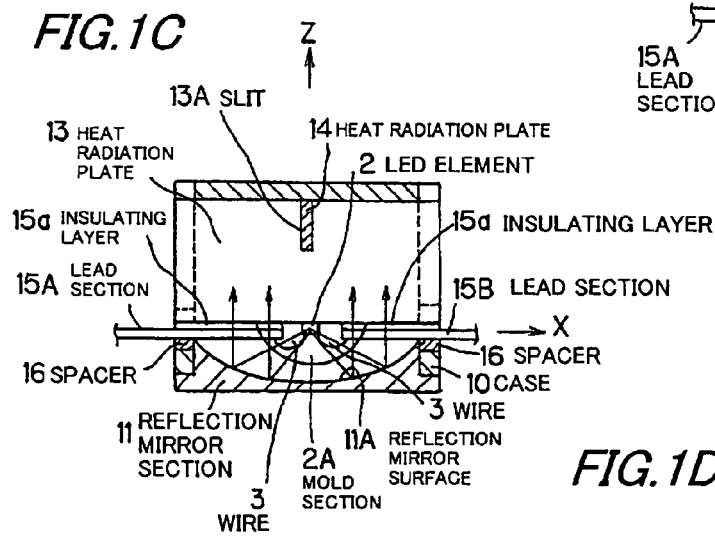
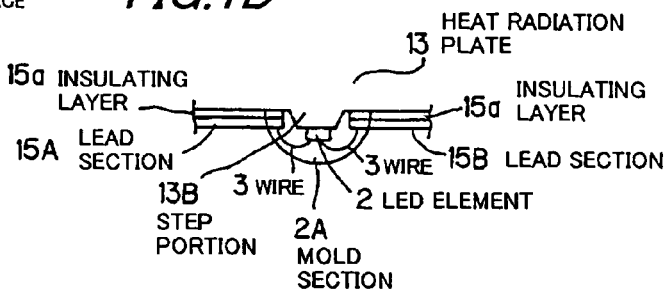

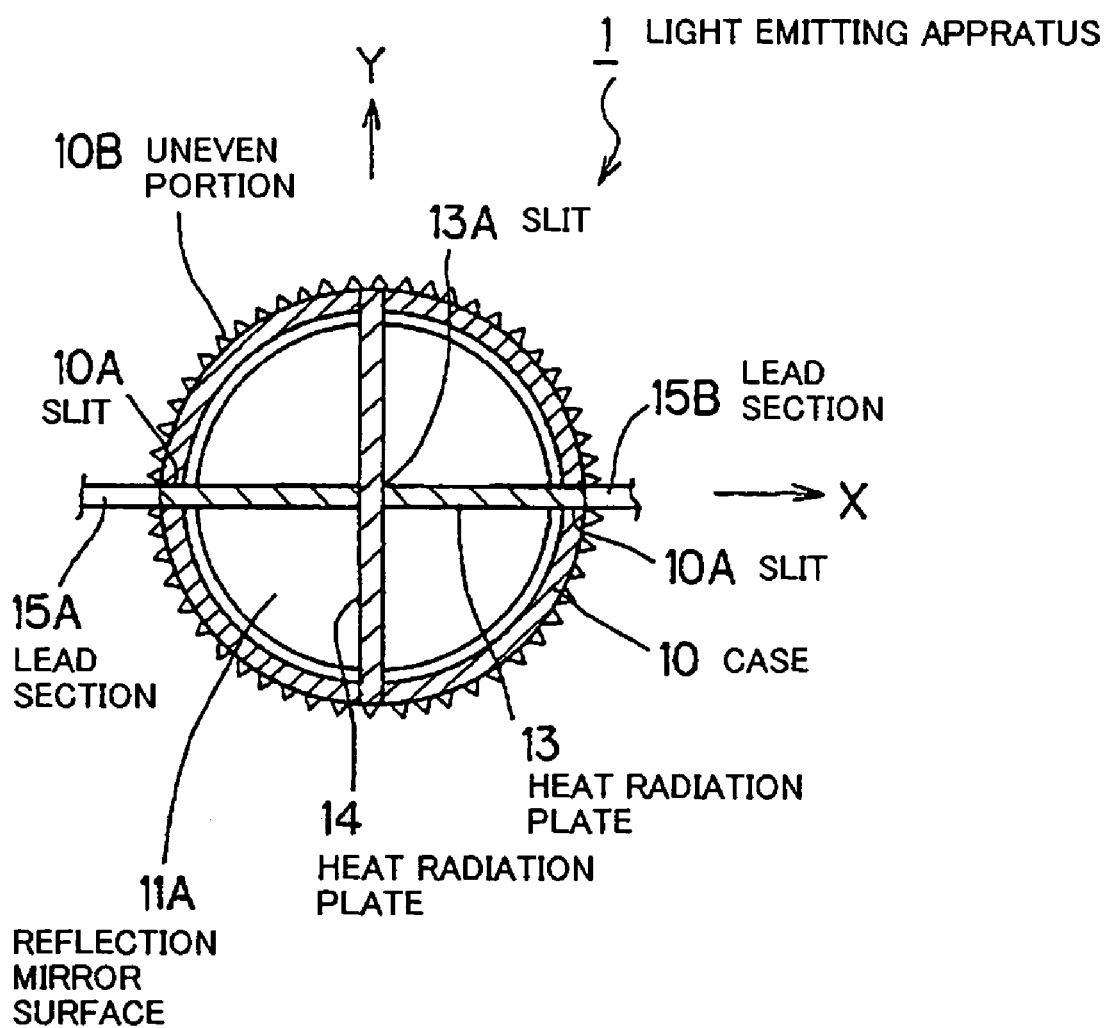

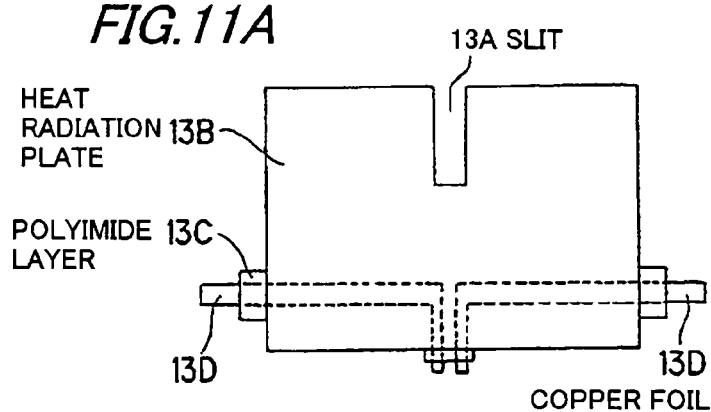
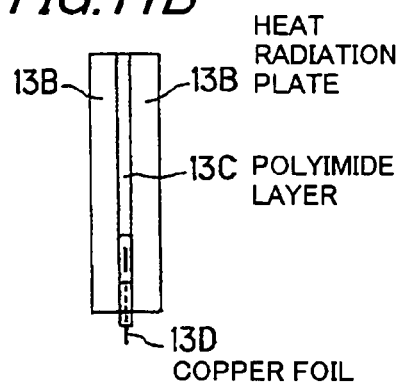
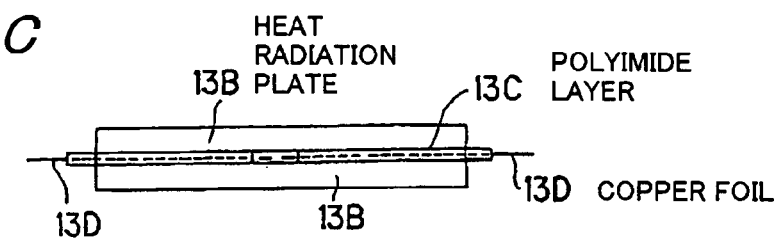
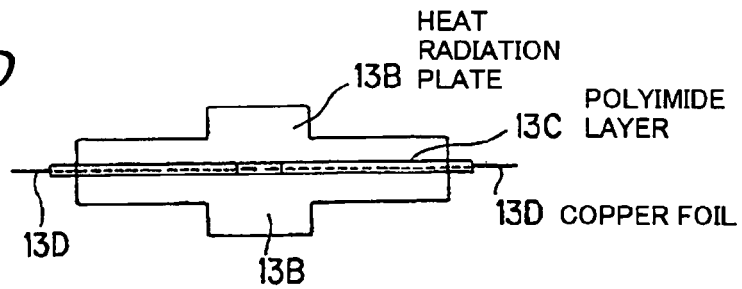
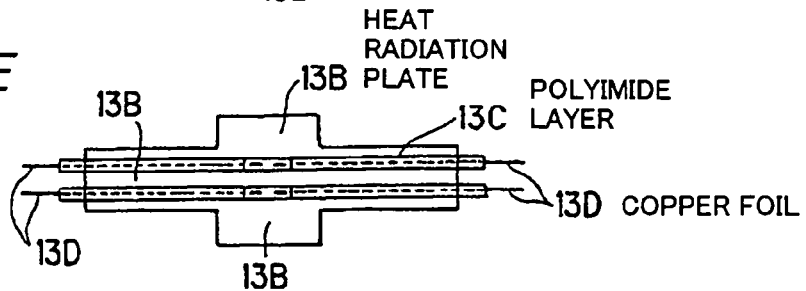

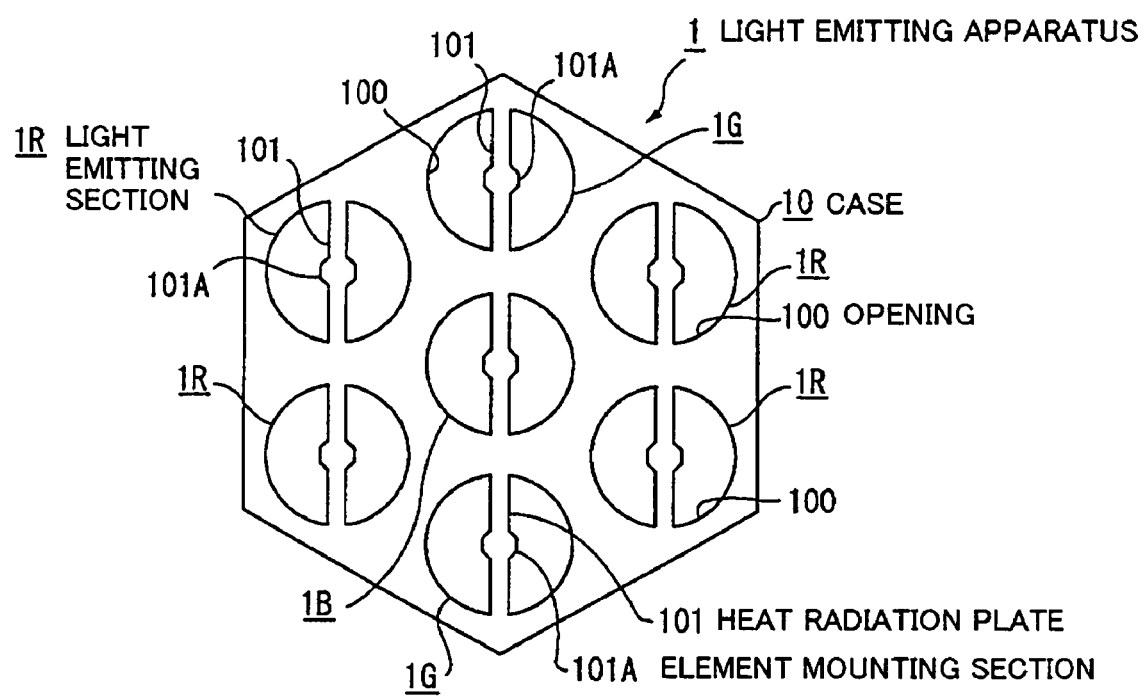

LIGHT EMITTING APPARATUS

The present application is based on Japanese patent application Nos. 2003-373274 and 2004-251021, the entire contents of which are incorporated herein by reference.

TECHNICAL FIELD

The present invention relates to a light emitting apparatus and, in particular, to a reflection-type light emitting apparatus that reflects light emitted from a light emission surface of a light source and radiates the reflected light to the backside of the light source.

BACKGROUND ART

Japanese patent application laid-open No. 5-291627 discloses a reflection-type light emitting apparatus in which an LED (Light Emitting Diode) element is located opposite to a reflection mirror so as to reflect light emitted from the LED element and emit the reflected light in a desired direction. The reflection-type light emitting apparatus has a problem that part of light is blocked by the LED element and a lead for power supply that are located on an optical path of reflected light, although it has good light radiation efficiency since the reflection-type light emitting apparatus can focus light in high efficiency.

LED's with high output are recently developed along with increasing applications of LED, and LED's of large output type such as several watts are already on the market. Although LED's are characterized in its less heat generation, in order to provide LED with high output, a large amount of electric current needs to be supplied to the LED element. As a result, a considerable amount of heat generation occurs in the LED element.

The light emitting apparatus disclosed in Japanese patent application laid-open No. 5-291627 is composed such that the LED element is mounted on a lead, an electrode of the LED element and the lead are wire-bonded and sealed with a first light transmitting material, and the first light transmitting material and the lead are sealed with a second light transmitting material. The second light transmitting material has a concave reflection surface formed opposite to the light emitting surface of LED element and has a flat radiation surface formed on the backside of the LED element. Light emitted from the LED element is reflected on the concave reflection surface and then the reflected light is radiated from the radiation surface to the outside of light emitting apparatus.

In the conventional reflection-type light emitting apparatus, heat generated when turning on the LED element is transferred and radiated through the lead to the outside. However, if the lead is enlarged to cope with an increase in heat generation, light emission efficiency of the apparatus must lower since the reflected light is blocked by the enlarged lead. Thus, there is a barrier in enhancing the light emission efficiency.

It is an object of the present invention to provide a reflection-type light emitting apparatus that has an excellent heat radiation performance and can minimize a reduction in emission efficiency of reflected light.

It is a further object of the present invention to provide a reflection-type light emitting apparatus that has a reduced number of components.

DISCLOSURE OF INVENTION

According to one aspect of the invention, a light emitting apparatus comprises:
a light source section comprising a solid-state light emitting element;
a power supply section that supplies power to the light source section;
a reflection section that is disposed opposite to a light extraction surface of the light source section to reflect light emitted from the light source section; and
a heat radiation section that is disposed with a heat radiation width in a back direction of the light source section.

According to another aspect of the invention, a light emitting apparatus comprises:
a light source section comprising a solid-state light emitting element;
a power supply section that supplies power to the light source section;
a reflection section that is disposed opposite to a light extraction surface of the light source section to reflect light emitted from the light source section;
a heat radiation section that is disposed with a heat radiation width in a back direction of the light source section; and
a case in which the reflection section and the radiation section are placed and which externally radiates heat to be transferred from the heat radiation section.

The heat radiation section may be of the same material as the case.

The light source section can be packaged such that the solid-state light emitting element is sealed with a light transmitting material.

The light source section may comprise the solid-state light emitting element that is flip-chip mounted on a inorganic material board on which a conductive pattern is formed to supply power to the solid-state light emitting element, and the light source section is sealed with an inorganic seal material that has a thermal expansion coefficient nearly equal to that of the inorganic material board.

The inorganic seal material may be of glass.

The inorganic material board may seal the light emitting element while bonding in chemical reaction to the inorganic seal material.

It is desirable that the solid-state light emitting element is sealed with the inorganic seal material with a refractive index of 1.55 or more.

It is desirable that the case comprises a high reflectivity surface to reflect the light.

The case may comprise a surface that is subjected to a finishing to increase its heat radiation area.

It is desirable that the heat radiation section comprises a heat radiation plate that comprises a high reflectivity surface to reflect the light.

The heat radiation section may comprise a heat radiation support that is of a high thermal conductivity material and transfers to the heat radiation section heat generated from the light source section, and a heat radiation plate that transfers the heat through the heat radiation support.

According to another aspect of the invention, a light emitting apparatus comprises:
a light source section comprising a solid-state light emitting element;
a power supply section that supplies power to the light source section;
a reflection section that is disposed opposite to a light extraction surface of the light source section to reflect light emitted from the light source section; and a heat radiation section that is disposed with a heat radiation width in a back direction of the light source section, wherein the power supply section is formed with a width in the back direction of the light source section.

The power supply section may comprise a metallic thin film and may be disposed with a width in the back direction of the light source section and may be integrated with the heat radiation section while being insulated from the heat radiation section.

The power supply section may comprise a metallic thin film and may be sandwiched through an insulator between a plurality of heat radiation plates to compose the heat radiation section.

A spectrum light with plurality of region wavelengths may be radiated from the solid-state light emitting element or from the periphery of the solid-state light emitting element.

A phosphor may be disposed on the periphery of the solid-state light emitting element.

It is desirable that the heat radiation section has the heat radiation width that is three times or more its thickness.

It is desirable that the light source section including the solid-state light emitting element has a width that is within five times that of the solid-state light emitting element.

The heat radiation section may comprise a shape that protrudes toward a bottom of the reflection surface.

The reflection surface opposite to the light source section may comprise a solid angle of $2\pi$ to $3.4\pi$ strad.

The light source section may comprise a light source with a turn-on power of 1 W or more.

The reflection section may be of a resin material.

The light source section may comprise a plurality of solid-state light emitting elements.

The light emitting apparatus may comprise a plurality of the light source sections, and a plurality of the reflection sections and the heat radiation sections corresponding to the plurality of the light source sections.

The plurality of the light source sections may generate a plurality of emission colors.

The plurality of the light source sections may generate emission colors of R, G and B.

BRIEF DESCRIPTION OF DRAWINGS

FIG. 1A is a perspective view showing a reflection-type light emitting apparatus in a first preferred embodiment of the present invention;

FIG. 1B is a horizontal cross sectional view cut-along a line B-B in FIG. 1A;

FIG. 1C is a vertical cross sectional view cut along a line C-C in FIG. 1A;

FIG. 1D is a partial enlarged view showing a modification of a LED element-mounting section;

FIG. 2 is a cross sectional view showing a reflection-type light emitting apparatus in a second preferred embodiment of the present invention;

FIG. 11A is a front view showing a heat radiation plate in the eighth preferred embodiment;

FIG. 11B is a side view showing the heat radiation plate in FIG. 11A;

FIG. 11C is a bottom view showing the heat radiation plate in FIG. 11A;

FIGS. 11D and 11E are bottom views showing a heat radiation plate that has a central section thicker than both end sections;

FIG. 15 is a plain view showing a reflection-type light emitting apparatus in a tenth preferred embodiment of the present invention;

BEST MODE FOR CARRYING OUT THE INVENTION

Figure 3A:
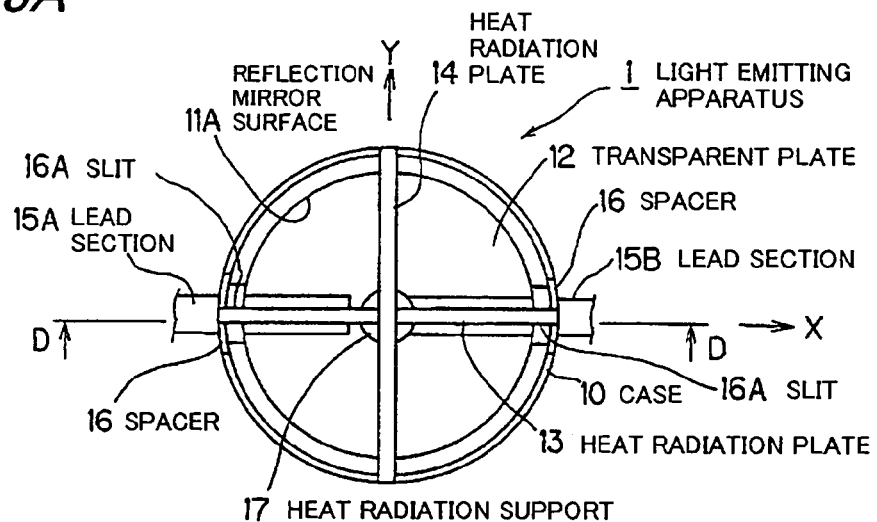
FIG. 3A is a plain view showing a reflection-type light emitting apparatus in a third preferred embodiment of the present invention.

Light emitting apparatuses in the preferred embodiments of the invention are explained in detail below, referring to the drawings.

(1) First Preferred Embodiment

FIG. 1A is a perspective view showing a reflection-type light emitting apparatus in the first preferred embodiment of the present invention, FIG. 1B is a horizontal cross sectional view cut along a line B-B in FIG. 1A, FIG. 1C is a vertical cross sectional view cut along a line C-C in FIG. 1A, and FIG. 1D is a partial enlarged view showing a modification of a LED element-mounting section.

A light emitting apparatus 1 has: a case 10 of a metallic material with a good heat radiation property; a reflection mirror section 11 formed to be engaged with a lower section of the case 10; a transparent plate 12 with a transparency to cover an upper surface of the case 10; heat radiation plates 13, 14 that are of a metallic material with a good heat conductivity and are inserted inside the case 10; an LED element 2 mounted on the heat radiation plate 13; lead sections 15A, 15B that are a power supply member fixed to the heat radiation plate 13 through an insulating layer 15a to supply power to the LED element; and a spacer 16 that is of an insulating material to insulate the lead sections 15A, 15B from the case 10. It is defined that in the following explanation a light emitting surface of the LED element 2 is an origin, a central axis of the LED element 2 is a Z-direction, a pulled-out direction of the lead sections 15A, 15B perpendicular to the central axis is an X-direction, and a direction perpendicular to these directions is a Y-direction.

The LED element 2 is composed of a GaN based semiconductor and has a chip size of 1×1 mm. The LED element 2 with a standard size of 0.3×0.3 mm may be used. And the LED element 2 includes an electrode (not shown) for power supply on an upper surface thereof, and is electrically connected through the electrode and a wire 3 to the lead sections 15A, 15B. The LED element 2 is sealed with a mold section 2A of a silicon resin. A bottom surface of the LED element 2 is bonded to the heat radiation plate 13 by an adhesive such as a silver paste.

The case 10 is of a metallic material such as aluminum with a good heat radiation property and good workability, and is formed cylindrical. An inner wall surface thereof is mirror-finished to have improved flatness. Namely, the inner wall surface has a high linear reflectivity. A slit 10A is formed in a side surface of the case 10 in which the heat radiation plate 14 is engaged.

The reflection mirror section 11 is of a metallic material such as copper with a good heat radiation property. The reflection mirror surface 11A is formed in a region where light emitted from the LED element is irradiated to. The reflection mirror surface 11A with φ10 mm, in the state of the light emitting apparatus being assembled, is concaved in an arc shape with a rotational parabolic surface shape that has as a focus point the origin of coordinates in FIG. 1 and its center axis corresponds to the Z axis. The reflection mirror surface 11A is mirror-finished by silver plating. The reflection mirror section 11 is formed to be engageable with the case 10.

The transparent plate 12 is formed like a flat plate by a resin with transparency, and transmits light reflected from the reflection mirror surface 11A as well as covering the upper surface of the case 10 to prevent the entering of foreign materials.

The heat radiation plates 13, 14 are copper plates each having good heat conductivity and a thickness of 0.5 mm and a width (in the Z-direction) of 5 mm. It is mirror-finished by silver plating on a surface of material with a small surface roughness. A slit 13A is disposed at the center of the heat radiation plate 13 for inserting the heat radiation plate 14. The heat radiation plate 14 is inserted into the slit 13A and is located perpendicular to the heat radiation plate 13. The heat radiation plate 13 is attached engaged with the slit 10A of the case 10. An LED element-mounting section of the heat radiation plate 13 is 2.0 mm square with a width enlarged to have a shape suitable for mounting the LED element 2 by press or the like.

The lead sections 15A, 15B are of copper with excellent heat conductivity, and its surface is with silver plating to enhance the bonding performance of wire 3 and light reflection property. The lead sections 15A, 15B are bonded to an end face of the heat radiation plate 13 through an insulating layer 15a such as polyimide so as not to be short-circuited through the heat radiation plate 13.

The spacer 16 is inserted into the case 10 to secure the lead sections 15A, 15B to a predetermined position as well as insulating the lead sections 15A, 15B so as not to be short-circuited to the case 10 electrically.

Next, a process of making the light emitting apparatus in the first preferred embodiment will be explained below.

First, silver plating is ahead formed on the lead sections 15A, 15B being held in a lead frame (not shown) so as to enhance the bonding performance of wire 3. Light irradiated on the lead surface is reflected due to the silver plating. Then, the lead sections 15A, 15B are bonded through the insulating layer 15a to the end face of the heat radiation plate 13 that is mirror-finished. Then, the LED element 2 is mounted on the end face of the heat radiation plate 13, electrodes (not shown) are bonded to the lead sections 15a, 15B through the wire 3, and the LED element 2 is sealed with a resin to form a mold section 2A. Then, the lead sections 15A, 15B are separated from the lead frame. Then, the spacer 16 is incorporated in the case 10. Then, the heat radiation plate 13 with the LED element 2 and the lead sections 15A, 15B bonded thereto is inserted into the slit 10A of the case 10, and is pushed into up to a position of the spacer 16. Then, the reflection mirror section 11 prepared previously is inserted into the bottom of the case 10, i.e., into an opening located on the light emission side of the LED element 2. Then, a transparent plate 12 is attached on the upper side of the case 10, i.e., on the backside of the LED element 2, to be integrally assembled therein.

The operation of the light emitting apparatus 1 in the first preferred embodiment will be explained below.

When power is supplied to the lead sections 15A, 15B laid exposed outside of the case 10 from a power source section (not shown), the LED element 2 is turned on. Most of light emitted from the LED element 2 is reflected on the reflection mirror surface 11A of the reflection mirror section 11 and heads to the direction shown in FIG. 1C, i.e., to the back side of the LED element 2 as reflecting light parallel to the Z-axis. Then, it is externally radiated through the transparent plate 12 together with light partially reflected on the inner wall surface of the case 10 as well as on the surface of the heat radiation plates 13, 14.

Heat generated by the turn-on the LED element 2 is transferred through the heat radiation plates 13, 14 to the case 10 and is then radiated into the air.

The following effects are obtained according to the first preferred embodiment.

(1) Since the LED element 2 is mounted on the end face of the heat radiation plate 13, heat generated by the turn-on the LED element 2 is quickly transmitted to the case 10 through the lead sections 15A, 15B and the heat radiation plates 13, 14. Therefore, even if the amount of heat generated increases due to an increase in output of the LED element 2, an excellent heat radiation property can be obtained.

(2) The heat radiation plates 13, 14 to compose the heat radiation section have a heat radiation width in the back side (in the Z-axis direction) of the LED element 2. Namely, since the normal-line direction of the plate surfaces is in a direction perpendicular to the Z-axis, even when the optical diameter of φ10 is provided, the area of the LED element-mounting portion including the LED element 2 and the heat radiation plates 13, 14 are controlled to about 15% of the reflection surface with φ10. Thus, while securing an area sufficient for heat radiation, the external light radiation property can be enhanced since the end face of the heat radiation plates 13, 14 has a reduced area that the reflected light from the reflection mirror surface 11A is irradiated to and, therefore, stray light can be reduced that is generated when the reflected light is irradiated to the end face.

Hence, focused light radiation can be obtained at high efficiency in the downsized apparatus. When the optical diameter is further increased, the stray light can be further reduced to enhance the efficiency.

It is noted that, in the conventional case that a lead formed by punching a metal plate is used for heat radiation, the thickness of lead is at most approximately two times a punched width as the lead width. In contrast, in the invention, a heat radiation area can be obtained with a thickness (a width in the back direction of the LED element 2) ten times or more the lead width.

In order to have a downsized light emitting apparatus with a reduced optical diameter, it is important to reduce the LED element-mounting area to the LED element 2. For example, in case of using a package of φ7.5 with an LED element 2 of 1 mm square commercially available, the opposing reflection surface of φ10 causes that most of reflected light from the reflection surface is blocked by the package. Therefore, external light radiation cannot be obtained at high efficiency. Thus, it is needed that the LED element-mounting width is controlled within five times, desirably three times, that of LED element 2. Even when the optical diameter is further increased, it is desirable that the LED element-mounting surface is reduced, although the influence to efficiency is different from the previous case.

(3) Since the heat radiation plate 13 is supported by the case 10 and is also intersected to the heat radiation plate 14, the heat radiation plates 13, 14 can have a structural strength as a support member of the LED element 2 and the lead sections 15A, 15B in spite of using the thin-plate heat radiation plate 13.

(4) The inner wall surface of the case 10 and the surface of the heat radiation plates 13, 14 have a high linear reflectivity. Therefore, even when the reflected light reaches the surface while having an angle to the Z-axis widened due to a certain size of the LED element 2 as a light source, the reflected light from the reflection mirror surface 11A is not attenuated. Further, since most of the reflected light is reflected symmetrically to the incident light, the reflected light can be externally radiated from the case 10 while keeping its collecting power.

(5) Since the inner wall surface of the case 10 has a high linear reflectivity, even when the heat radiation plate has a width in the Z-direction and the inner wall surface of the case 10 is disposed within the optical path of reflected light from the reflection mirror surface 11A, light can be efficiently radiated externally from the case 10. Therefore, a compact package can be obtained. This can be also applied to reflected light that has an angle further widened due to a change in shape of the reflection mirror surface 11A, where a further effect can be obtained.

(6) Since the case 10 is of aluminum with high heat conductivity, heat from the heat radiation plate 13 is rapidly transferred to the entire case 10. Thus, heat generated from the LED element 2 is radiated into the air through the heat radiation plate 13 and the case 10. Therefore, a thermal resistance of 20° C./W or less can be obtained without using a heat sink that is needed for general large elements.

Although in the first embodiment the GaN based LED element 2 is used, the other LED elements such as an AlInGaP may be used.

The reflection-type light emitting apparatus may be a wavelength conversion type that its mold section 2A to seal the LED element 2 contains a phosphor. In this case, since in the reflection-type optical system the refractive index does not change depending on emission wavelength unlike a lens-type LED, color separation is not generated in focused light.

For example, a white light source is composed of spectrum lights with a plurality of wavelength regions such as blue light from LED and yellow light from a phosphor excited by the blue light, or blue, green, and red lights from phosphors excited by UV light from LED. In the case that such light is focused by and radiated through a lens, the refractive index of light changes with its wavelength and, therefore, light is radiated in different directions. This phenomenon becomes more significant as the collecting power increases or the lighting distance increases. In contrast, since in the reflection-type optical system the reflection angle does not depend on wavelength, this problem does not occur even when increasing the collecting power or lighting distance.

LED's other than high output types of LED's with a large amount of current supplied are not sufficient in the amount of light when used as a light source for illumination, but they seldom have a problem about color separation. Nevertheless, the high output types of LED's with a large amount of current supplied can be used as a light source for illumination.

Thus, according to the invention, in high output types of LED's that require a solution to heat generation, a light radiation with high lighting intensity and uniform color can be radiated at high efficiency and collecting power without generating any color separation in radiating spectrum light with a plurality of wavelength regions. It should be noted that spectrum light with a plurality of wavelength regions is not limited to a combination of an LED element and a phosphor, and an LED element itself may have a spectrum property with a wide wavelength width or a plurality of LED elements with different colors may be closely arranged and sealed with a light diffusion member.

In case of collecting light by a lens and a reflection mirror at the periphery of the lens, it is difficult to obtain light with uniform lighting intensity between light radiated through the lens and light radiated through the reflection mirror. However, in the invention, since light is collected by using the single reflection surface, light with uniform lighting intensity can be radiated.

A chip LED may be used as a light source. The chip LED means a compact LED produced such that an LED element is mounted on a board and electrically connected, and then is sealed with a sealing member as a whole and is formed in a pellet shape by dicing.

A material of light transparency may be filled in a gap between the LED element 2 and the reflection mirror surface 11A.

The heat radiation plates 13, 14 are not limited to copper so long as they are of a metallic material with excellent heat radiation property, and may be of, e.g., aluminum or other materials. They are preferably of a material with heat conductivity of 100 W·m$^{-1}$·k$^{-1}$ or more.

The suitable dimensions of the heat radiation plates 13, 14 with a radiation width in the back direction of light source section depend not only on the heat conductivity of material but also on the power supplied to light source or the heat resistance of light source. When the radiation plates have the radiation width three times or more the thickness thereof, they can have a significant difference to the lead frame that is formed like a flat plate and perpendicular to the center axis of reflection mirror.

The heat radiation section may be composed such that the lead sections 15A, 15B function as a heat radiation plate by having a width in the back direction of the LED element 2.

The transparent plate 12, other than the function to cover the upper surface of the case 10, may serve to conduct the light collection and light diffusion as an optical system. For example, the transparent plate 12 can be formed as a transparent section like a condenser lens and can collect in form of a spot reflected light to be externally radiated from the case 10.

Further, one surface of the flat transparent plate 12 may be roughened by hologram technology so as to radiate light within a predetermined angle while diffusing light to be externally radiated.

When the transparent plate 12 is of glass and a surface thereof is provided with a phosphor thin film, the light emitting apparatus 1 of wavelength conversion type can be obtained that has good light stability, good thermal resistance, and good wavelength conversion property even by using a small amount of phosphor.

FIG. 1D is an enlarged view showing the mounting section of LED element 2. The mounting section of LED element 2 thus may be projected from the surface of lead section 15A, 15B. In this case, since light laterally emitted from the LED element 2 is not blocked by the lead sections 15A, 15B, the external radiation efficiency of light can be improved.

(2) Second Preferred Embodiment

FIG. 2 is a cross sectional view showing a reflection-type light emitting apparatus in the second preferred embodiment of the present invention. The cross section is cut along the line B-B in FIG. 1. The light emitting apparatus 1 of the second preferred embodiment is different from the light emitting apparatus 1 of the first preferred embodiment in that an uneven portion 10B is formed on an outer surface of the case 10 to increase a heat radiation area.

In the second preferred embodiment, the surface area of the case 10 is enlarged by the uneven portion 10B and heat transmitted through the heat radiation plates 13, 14 to the case 10 can be efficiently radiated into the air. It should be noted that the same effect can be obtained by roughening the outer surface of the case 10 by blasting etc. instead of providing the uneven portion 10B. Alternatively, the uneven formation and the roughening may be conducted together.

(3) Third Preferred Embodiment

Figure 3B:
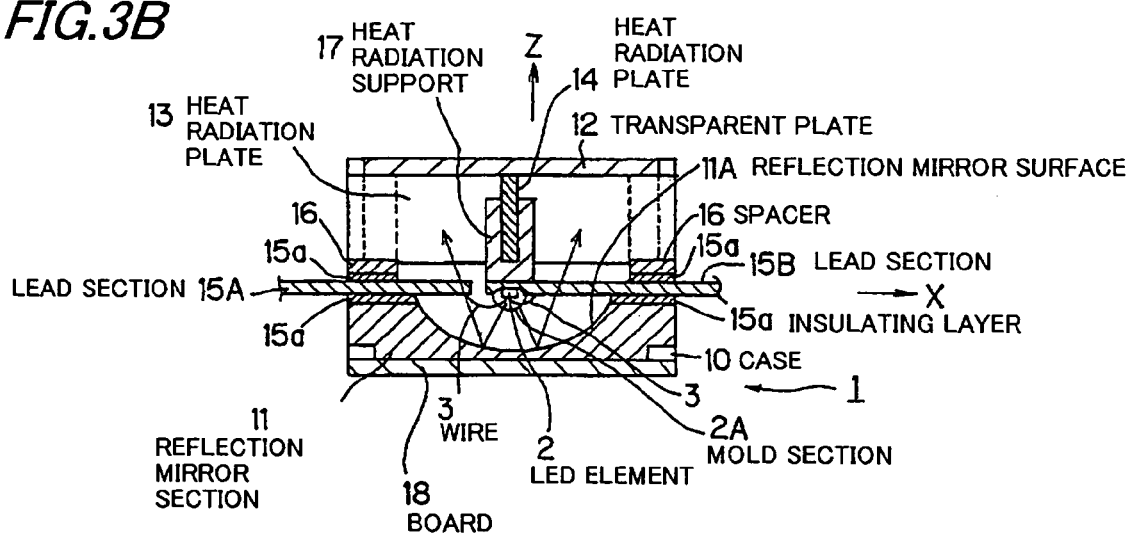
FIG. 3B is a horizontal cross sectional view cut along a line D-D in FIG. 3A.
Figure 3C:
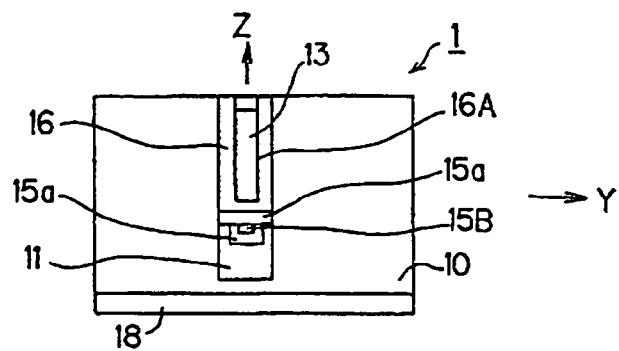
FIG. 3C is a side view showing the reflection-type light emitting apparatus in the third embodiment.

FIG. 3A is a plan view showing a reflection-type light emitting apparatus in the third preferred embodiment of the present invention. FIG. 3B is a horizontal cross sectional view cut along a line D-D in FIG. 3A. FIG. 3C is a side view showing the reflection-type light emitting apparatus 1 in the third preferred embodiment of the present invention.

The light emitting apparatus 1 in the third preferred embodiment is different from the first preferred embodiment in that there are provided a heat radiation support 17 of a heat transfer material to support the heat radiation plates 13, 14 at their centers, a lead section 15B bonded to an end face of the heat radiation support 17, i.e., a side face opposite to the reflection mirror section 11, and a board 18 bonded to a lower section of the case 10. In the following explanation, components identical to those in the first preferred embodiment are referred to as identical numerals.

The reflection mirror section 11 includes an insulating layer 15a provided in portions contacting the lead sections 15A, 15B.

The heat radiation plates 13, 14 are an aluminum plate with good heat conductivity and a thickness of 0.1 mm, and a mirror-like plate with a low surface roughness. A slit (not shown) is formed in the center of heat radiation plates 13, 14 to be engaged with the heat radiation support 17. The heat radiation plate 13 is supported by the case 10 through the spacer 16.

The lead sections 15A, 15B are of copper with good heat conductivity and a surface thereof is coated with silver for light reflectivity. The lead section 15B has a portion on which the LED element 2 is mounted, and such portion is concaved. The lead section 15B is bonded to an end face of the heat radiation support 17. The LED element 2 is sealed at the tip of the lead section 15B by a mold section 2A of epoxy resin.

The spacer 16 is of aluminum with excellent heat conductivity and has an insulating layer 15a at the bottom to be electrically insulated from the lead sections 15A, 15B. The insulating layer 15a may be provided on the lead sections 15A, 15B.

The board 18 is of aluminum like the case 10 and is bonded to the bottom of the case 10.

Figure 4A:
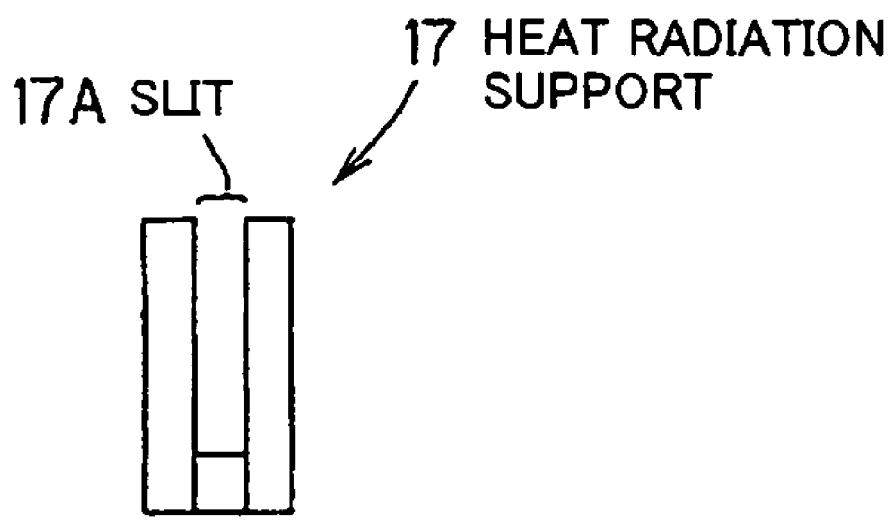
FIG. 4A is a side view showing a heat radiation support.
Figure 4B:
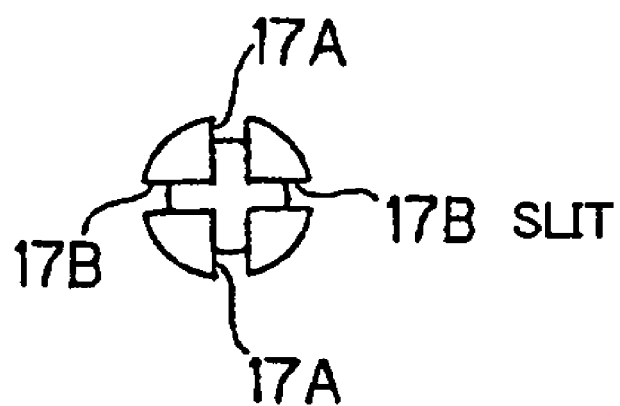
FIG. 4B is a plain view showing the heat radiation support.

FIG. 4A is a side view showing the heat radiation support 17 and FIG. 4B is a plain view showing the heat radiation support 17. The heat radiation support 17 is of copper and a surface thereof is coated with silver, and has slits 17A, 17B to support the heat radiation plates 13, 14 while being intersected with each other at the center.

Next, a process of making the light emitting apparatus in the third preferred embodiment will be explained below.

First, silver plating is ahead formed on the lead sections 15A, 15B held in the lead frame (not shown) so as to enhance the bonding performance of wire 3. Then, the LED element 2 is mounted on the tip of the lead section 15B, and electrodes (not shown) of the LED element 2 are bonded to the lead sections 15A, 15B by the wire 3, and the LED element 2 is sealed with resin to form the mold section 2A. Then, the heat radiation support 17 is bonded to the tip of lead section 15B through a blazing filler material etc. Then, the reflection mirror section 11 previously formed is incorporated in the case 10. Then, the lead sections 15A, 15B with the LED element 2 and the heat radiation support 17 integrated therewith are incorporated in the case 10. Then, the lead sections 15A, 15B are separated from the lead frame (not shown). Then, the spacer 16 is incorporated in the case 10. Then, the heat radiation plates 13, 14 are incorporated in the case 10. In this case, the central portion of heat radiation plates 13, 14 is inserted into the slits 17A and 17B of the heat radiation support 17 and the heat radiation plate 13 is incorporated in the slit 16A of the spacer 16. Then, the board 18 is bonded to the bottom of the case 10. Then, the transparent plate 12 is attached to the upper surface of the case 10 to be integrated therewith.

The following effects can be obtained by the third preferred embodiment described above.

(1) Since heat generated by the turn-on of the LED element 2 is transferred from the lead section 15B through the heat radiation support 17 to the heat radiation plates 13, 14, a heat radiation path can be secured that provides sufficient heat transfer property for the LED element 2 of high output.

(2) Since the heat radiation plates 13, 14 can be made thinner than those in the first preferred embodiment by virtue of the heat radiation support 17 to support the heat radiation plates 13, 14, stray light is less likely to be generated and the external radiation property of reflected light can be enhanced.

(4) Fourth Preferred Embodiment

Figure 5A:
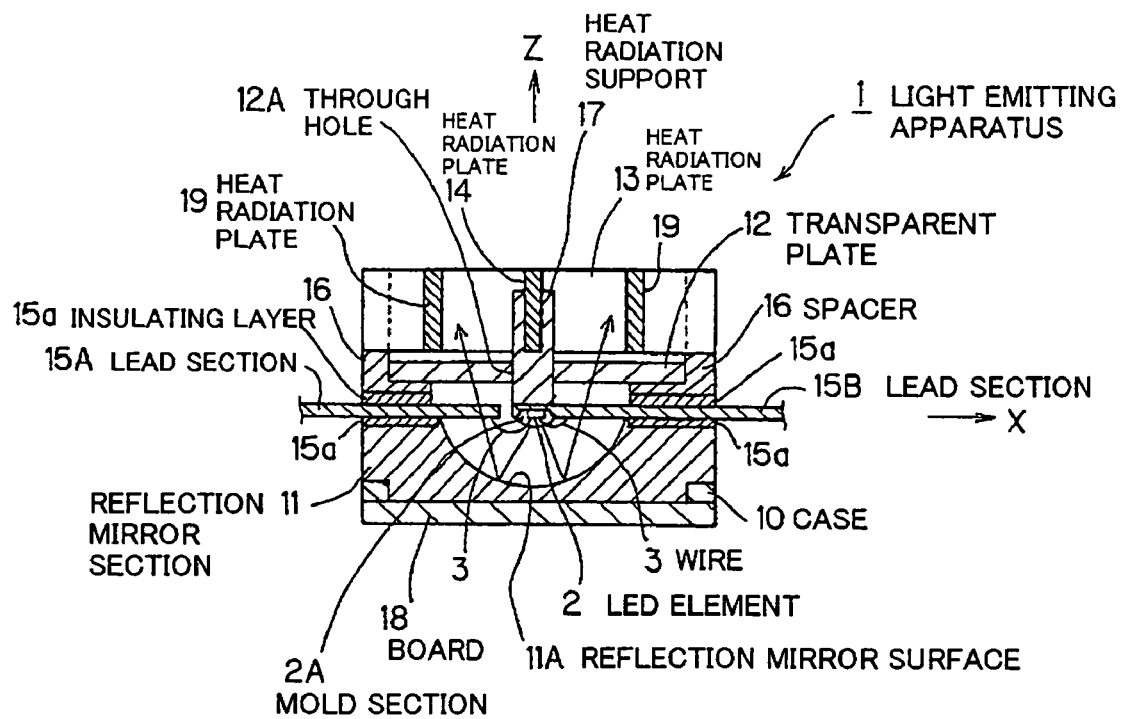
FIG. 5A is a vertical cross sectional view showing a reflection-type light emitting apparatus in a fourth preferred embodiment of the present invention.
Figure 5B:
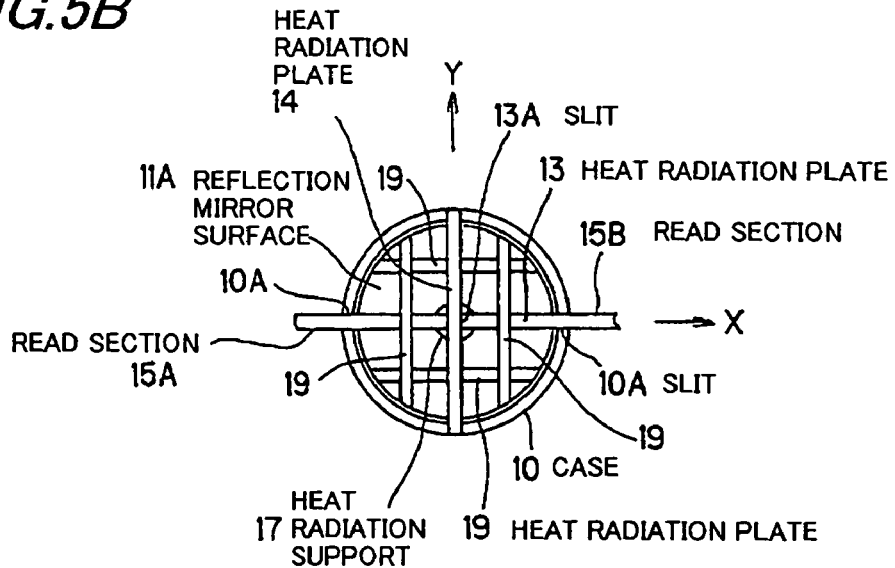
FIG. 5B is a plain view seen in a Z-direction in FIG. 5A.

FIG. 5A is a vertical cross sectional view showing a reflection-type light emitting apparatus in the fourth preferred embodiment of the present invention and FIG. 5B is a plain view seen from the Z-direction in FIG. 5A.

The light emitting apparatus 1 is, as shown in FIG. 5A, structured such that the transparent plate 12 of the light emitting apparatus 1 explained in the third preferred embodiment is disposed under the heat radiation plates 13, 14. Namely, the transparent plate 12 is, as shown in FIG. 5B, disposed in the case 10 under the heat radiation plates 13, 14 to expose the heat radiation plates 13, 14 to the air. Further, heat radiation plates 19 are disposed in addition to the heat radiation plates 13, 14 thereby to arrange the heat radiation plates 13, 14, and 19 in a lattice pattern. The other components are formed as in the third preferred embodiment.

The transparent plate 12 has a through hole 12A through which the heat radiation support 17 passes and is supported by the spacer 16 inside the case 10. The heat radiation support 17 is positioned at the center of the case 10 by the through hole 12A. The reflection mirror surface 11A has Ø10 mm and the heat radiation plate 19 has a thickness of 0.1 mm.

Next, a process of making the light emitting apparatus 1 in the fourth preferred embodiment will be explained below.

First, silver plating is ahead formed on the lead sections 15A, 15B held in the lead frame (not shown) so as to enhance the bonding performance of wire 3. Then, the LED element 2 is mounted on the tip of the lead section 15B, and electrodes (not shown) of the LED element 2 are bonded to the lead sections 15A, 15B by the wire 3 and the LED element 2 is sealed with resin to form the mold section 2A. Then, the heat radiation support 17 is bonded to the tip of the lead section 15B through a blazing filler material etc. Then, the reflection mirror section 11 previously formed is incorporated in the case 10. Then, the lead sections 15A, 15B with the LED element 2 and the heat radiation support 17 integrated therewith are incorporated in the case 10. The lead sections 15A, 15B are separated from the lead frame (not shown). Then, the spacer 16 is incorporated in the case 10. Then, the board 18 is bonded to the bottom of the case 10. Then, the transparent plate 12 is inserted into the case 10 from the upper side to be fitted in the spacer 16. In this case, the heat radiation support 17 is passed through the through hole 12A. Then, the heat radiation plates 13, 14 are incorporated in the case 10. In this case, the central portion of heat radiation plates 13, 14 are inserted into the slits 17A and 17B of the heat radiation support 17 and the heat radiation plate 19 is incorporated perpendicular to the heat radiation plates 13, 14.

The following effects can be obtained by the fourth preferred embodiment described above.

(1) Since the heat radiation support 17 and the heat radiation plates 13, 14 and 19 are disposed outside the transparent plate 12, the radiation performance of heat generated by the turn-on of the LED element 2 can be enhanced.

(2) Since arrangement of the heat radiation plates 13, 14 and 19 can be easily changed depending on the quantity of heat generated from the LED element 2, the heat radiation performance of package can be suitably set according to its application. The light emitting apparatus can be obtained that has an excellent design based upon the arrangement of heat radiation plates 13, 14 and 19.

(3) Since the heat radiation plates 13, 14 and 19 are formed thinner, the blocking of light is negligible small and the heat radiation area can be significantly increased. Further, in addition to the effect of the above (1), sufficient heat radiation performance can be obtained even without transferring heat to the case 10.

(4) Since the heat radiation support 17 is supported by the through hole 12A of the transparent plate 12, the heat radiation plates 13, 14 and 19 in a thin plate can be stably held.

(5) Fifth Preferred Embodiment

Figure 6:
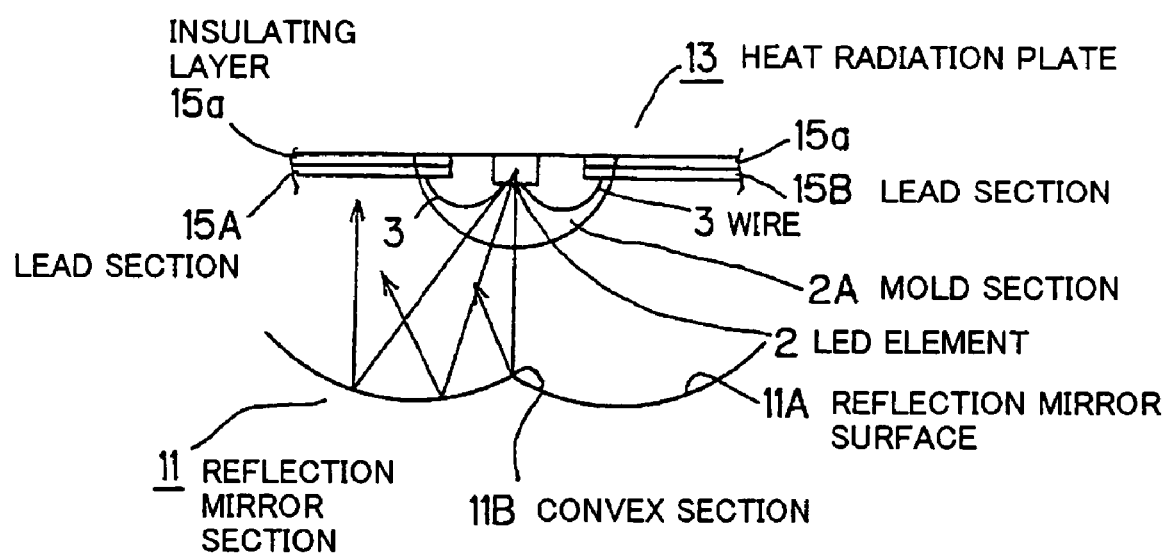
FIG. 6 is a partial structural view showing a reflection mirror section in a fifth preferred embodiment of the present invention.

FIG. 6 is a partial structure view showing a reflection mirror section in the fifth preferred embodiment of the present invention.

The reflection mirror section 11 has a reflection mirror surface 11A with a convex section 11B formed directly under the LED element 2. In detail, it is formed by rotating around the center axis an elliptic curve that has focal points at the LED element 2 and at a position of 2R in the center-axis direction from the LED element 2 and of 2R/3 in a direction perpendicular to the center axis.

In the fifth preferred embodiment, light emitted directly under the LED element 2 is not reflected back in the direction of LED element 2. Therefore, the blocking of light by the LED element 2 can be reduced and the light extraction radiation property of reflected light can be enhanced.

Although in the fifth embodiment the convex section 11B is formed integrated with the reflection mirror surface 11A, the convex section 11B may be, for example, formed separated from the reflection mirror surface 11A to be bonded to the reflection mirror surface 11A through an adhesive or the like.

(6) Sixth Preferred Embodiment

Figure 7:
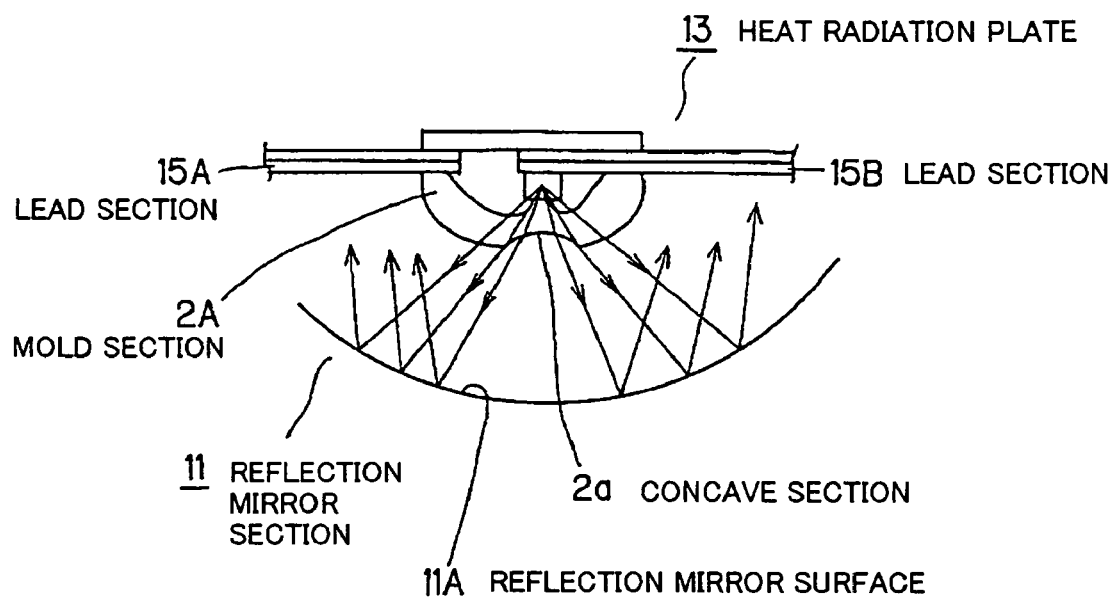
FIG. 7 is a partial structural view showing a mold section in a sixth preferred embodiment of the present invention.

FIG. 7 is a partial structure view showing a mold section 2A in the sixth preferred embodiment of the present invention.

The mold section 2A has a concave section 2a that is concaved in an arc form on the side of light radiation surface of the LED element 2.

In the sixth preferred embodiment, light emitted directly under the LED element 2 is refracted when radiated from the concave section 2a to outside of the mold section 2A. Namely, since light does not enter into part of the reflection mirror surface 11A placed directly under the LED element 2, the light extraction property of reflected light can be enhanced.

(7) Seventh Preferred Embodiment

Figure 8:
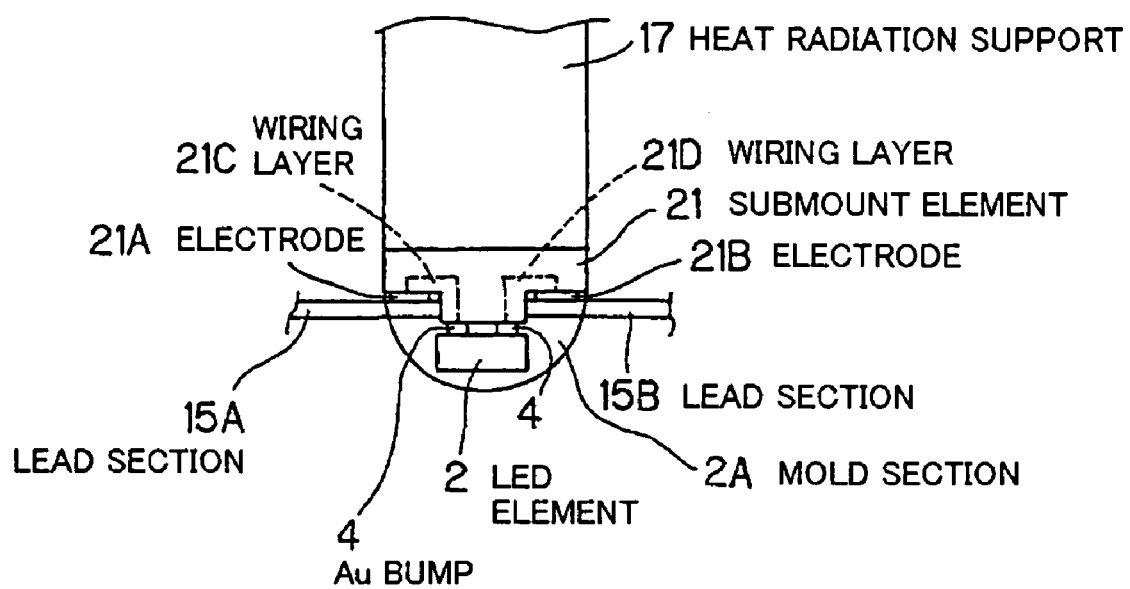
FIG. 8 is a partial structural view showing a LED element-mounting section in a seventh preferred embodiment of the present invention.

FIG. 8 is a partial structure view showing an LED element-mounting section in the seventh preferred embodiment of the present invention. The LED element 2 is of flip-chip type and is mounted on a sub-mount element 21 of aluminum nitride (AlN) with high heat conductivity through Au bumps.

The sub-mount element 21 has an electrode 21A electrically connected to the lead section 15A and an electrode 21B electrically connected to the lead section 15B, and the electrodes 21A, 21B are electrically connected to electrodes (not shown) of the LED element 2 through wiring layers 21C, 21D formed inside the sub-mount element 21. The heat radiation support 17 is attached to the sub-mount element 21.

In the seventh preferred embodiment, the flip-chip type LED element 2 with excellent light emission efficiency can be mounted due to using the heat radiation support 17 with the sub-mount element 21 attached thereto. Further, due to using no wire, the mold size can be made nearly equal to that of the element and the blocking of light by the LED element 2 can be reduced. Thus, the light extraction property of reflected light can be enhanced.

Further, heat generated by the turn-on of the LED element 2 can be transmitted through the sub-mount element 21 with good heat conductivity to the heat radiation support 17, and the heat can be efficiently radiated from the heat radiation plate bonded to the heat radiation support 17.

Although in the above preferred embodiments the LED element 2, the reflection mirror section 11, the lead sections 15A, 15B, the heat radiation plates 13, 14 etc. are placed in the case 10, when these components are fixedly installed, the case 10 may be omitted.

(8) Eighth Preferred Embodiment

Figure 9A:
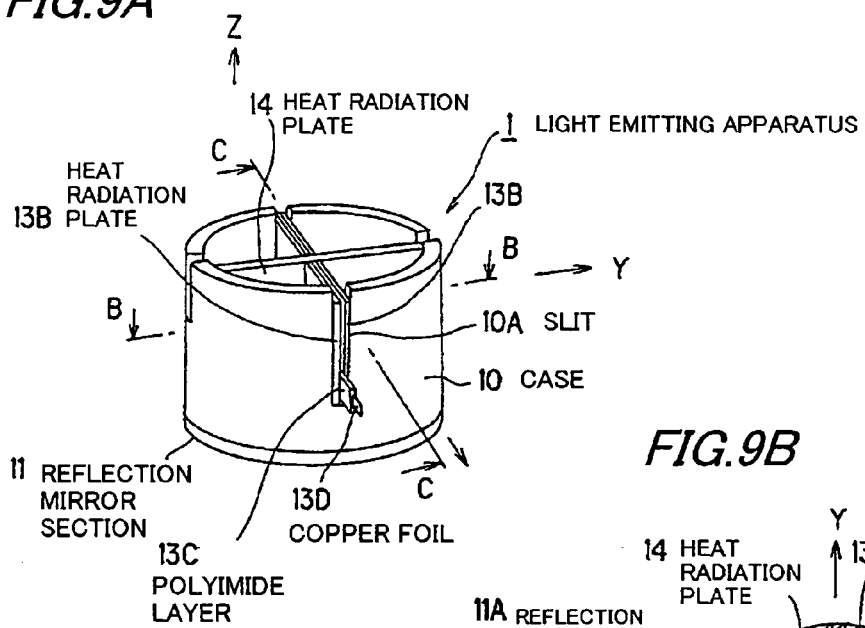
FIG. 9A is a perspective view showing a reflection-type light emitting apparatus in an eighth preferred embodiment of the present invention.
Figure 9B:
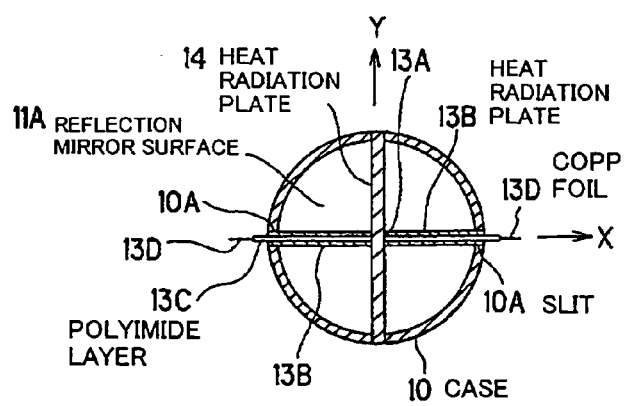
FIG. 9B is a horizontal cross sectional view cut along a line B-B in FIG. 9A.
Figure 9C:
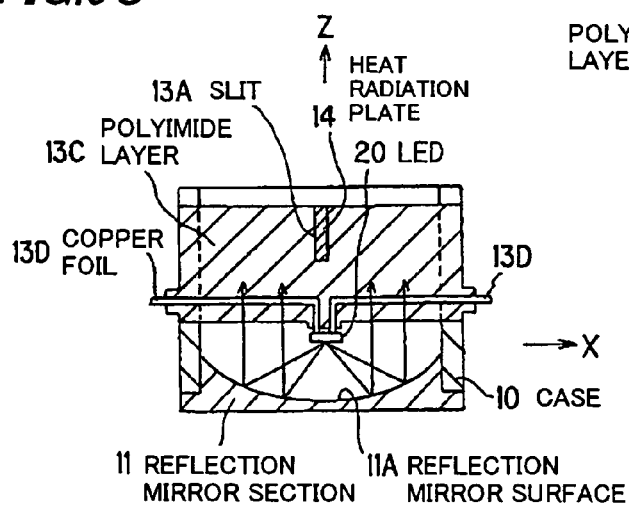
FIG. 9C is a vertical cross sectional view cut along a line C-C in FIG. 9A.

FIG. 9A is a perspective view showing a reflection-type light emitting apparatus in the eighth preferred embodiment of the present invention. FIG. 9B is a horizontal cross sectional view cut along a line B-B in FIG. 9A. FIG. 9C is a vertical cross sectional view cut along a line C-C in FIG. 9A.

The light emitting apparatus 1 is different from the light emitting apparatus 1 of the first preferred embodiment in that one of the heat radiation plates is composed of two metallic heat radiation plates 13B sandwiching a polyimide layer 13C and a copper plate 13D, that the lead section becomes unnecessary due to the copper plate 13D serving as a power supply member to supply power to the LED element, and further the insulating layer and the spacer to insulate the lead section from the case 10 become unnecessary, and that a glass seal type LED element 20 is electrically connected to the copper plate 13D. In the following explanation, components identical to those in the first preferred embodiment are referred to as identical numerals.

Figure 10:
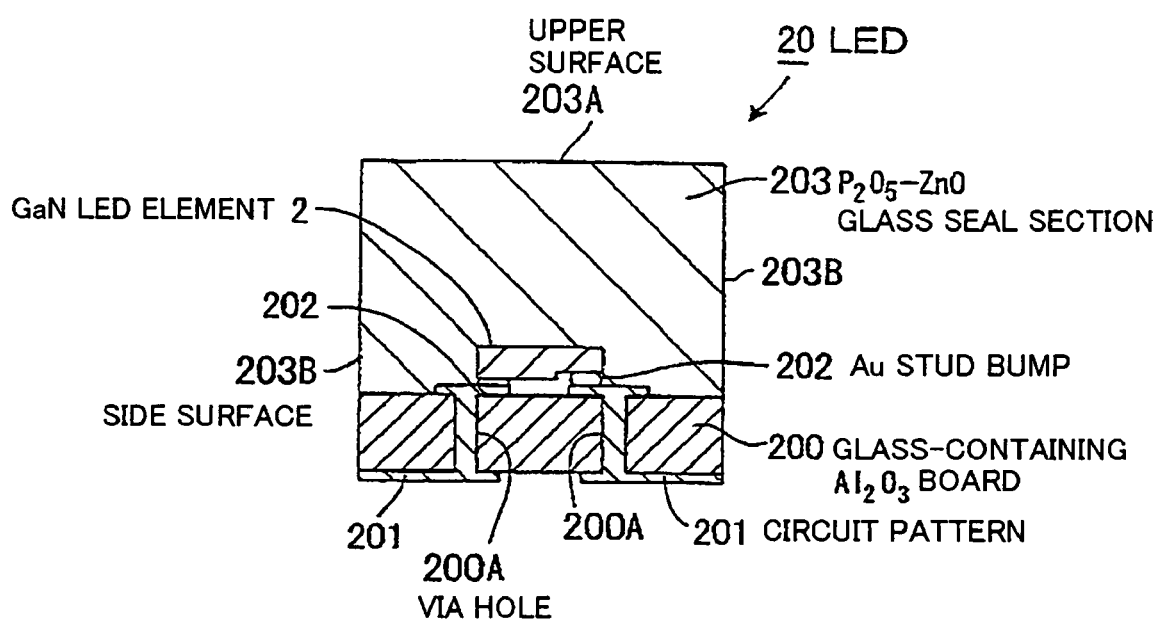
FIG. 10 is a cross sectional view showing an LED mounted on the light emitting apparatus.

FIG. 10 is a cross sectional view showing an LED 20 installed in the light emitting apparatus. The LED 20 comprises a flip-chip type GaN LED element 2 (with emission wavelength of 470 nm), a glass-containing $Al_2O_3$ board 200 (thermal expansion coefficient of $12.3\times10^{-6}/°$ C.) for mounting the GaN LED element 2 thereon, a circuit pattern 201 formed on the glass-containing $Al_2O_3$ board 200 and composed of Tungsten (W)-Nickel (Ni)-Gold (Au), Au stud bumps 202 to electrically connect the GaN LED element 2 to the circuit pattern 201, and a glass seal section 203 to seal the GaN LED element 2 and to be connected to the glass-containing $Al_2O_3$ board 200. The LED 20 is bonded to the heat radiation plate 13B through an insulating adhesive.

The glass-containing $Al_2O_3$ board 200 has a via hole 200A to supply electrical current to the circuit pattern 201 of W (Tungsten) that is metalized on the front and back surfaces of the board.

The glass seal section 203 is of phosphoric glass (heat expansion coefficient $11.4\times10^{-6}/°$ C., Tg=390° C., n=1.59) as a low-melting glass. After the glass seal section 203 is bonded to the glass-containing $Al_2O_3$ board 200 by hot pressing using a mold, it is formed into a rectangular shape with an upper surface 203A and a side surface 203B by dicing. Alternatively, it may contain a phosphor to be excited by blue light emitted from the GaN LED element 2 in the glass seal section 203 to radiate white light.

FIG. 11A is a front view showing the heat radiation plate comprising the heat radiation plate 13B, the polyimide layer 13C, and the copper plate 13D, FIG. 11B is a side view thereof, and FIG. 11C is a bottom view thereof.

The polyimide layer 13C has a side section and a lower section projected from the edge of the heat radiation plate 13B. Two copper plates 13D are placed such that they are sandwiched by the polyimide layers 13C while extending from the side projecting section to the lower projecting section of the polyimide layer, and are further projected from the projecting sections.

Two heat radiation plates 13B are a copper plate with good heat conductivity and a thickness of 0.2 to 0.3 mm, and they have a surface, opposite to its surface contacting the polyimide layer 13C, that is mirror-finished by silver plating to a material with small surface roughness. The other forms are the same as the heat radiation plate 13 in the first preferred embodiment.

The heat radiation plate 13B may be of the other metallic materials so long as it has good heat conductivity. For example, it may be of aluminum. In being of aluminum, since it has high heat conductivity and high reflectivity, the mirror-finish by plating etc. can be omitted. For example, a material with high linear reflectivity (80%) during metal rolling can be used.

The polyimide layer 13C is inserted between the two heat radiation plates 13B, and the polyimide layer 13C wraps the copper plate 13D. Herein the polyimide layer 13C insulates the heat radiation plate 13B from the copper plate 13D, as well as serving as a spacer to avoid a clearance formed when two heat radiation plates 13B are jointed together.

The polyimide layer 13C and the copper plate 13D are projected at the side section and the lower section from the edge of the heat radiation plate 13B as described above. Part of the copper layer 13D projected from the lower projecting section of the polyimide layer 13C is connected with the electrode of the LED element 2 through the solder bump or the like, and part of the copper layer 13D projected from the side projecting section of the polyimide layer 13C is connected with a wire from a power source to supply power to the LED element 2. The side projecting section and the lower projecting section of the polyimide layer 13C are used not only for the insulation as abovementioned but also for protecting the copper plate. It should be noted that in the present invention the insulating material is not limited to polyimide.

FIG. 11D is a bottom view showing a heat radiation plate with a central section that is thicker than both side sections. Although the heat radiation plate shown in FIG. 11C described above is suitable for mounting a standard LED element of 0.3×0.3 mm thereon, it is not suitable for mounting a large size LED package of 1×1 mm due to insufficiency in thickness of the heat radiation plate itself. However, when using the structure as shown in FIG. 11D, the large size LED package can be suitably mounted thereon without increasing the number of components.

Further, FIG. 11E is a bottom view showing a heat radiation plate with a central section that is thicker than both side sections, and further with two sets of copper plates as a power supply section. When a large size LED package is mounted thereon, power can be separately supplied to a plurality of LED elements mounted on the large size LED package. In the heat radiation plate in FIG. 11E, two sets of copper plates are used, but in the present invention three or more copper plates may be used.

Next, a process of making the light emitting apparatus in the eighth preferred embodiment will be explained below.

First, the two heat radiation plates 13B are provided, and the two polyimide films a little larger than the heat radiation plate 13B are provided. The copper plate 13D is sandwiched between the two polyimide layers to hold its desired form and they are further sandwiched between the two heat radiation plates 13B. Then, portions of the polyimide layer with two polyimide films projected from the two heat radiation plates 13B are removed to leave the side and lower projected sections as shown in FIG. 11A. After the surfaces of heat radiation plate 13B are mirror-finished by silver plating, a slit 13A is formed.

Alternatively, instead of providing ahead the two polyimide films, another process may be conducted such that the heat radiation plate 13B is coated with polyimide resin, the copper plate 13D is placed thereon, the copper plate 13D is coated with polyimide resin, and the other heat radiation plate 13B is placed thereon for sandwiching them.

Further alternatively, the other process may be conducted such that the copper plate is attached onto the polyimide film, the film is etched, the other polyimide film is attached on the side of copper plate to form a flexible board, and the flexible board is attached onto the heat radiation plates 13B.

A method of connecting the LED element 2 to the copper plate 13D in the light emitting apparatus of the eighth preferred embodiment will be explained below.

First, the lower projecting section of the polyimide layer 13C projected from the bottom of the heat radiation plate 13B is bent and is fixed to the lower edge of the heat radiation plate 13B by an adhesive. Then, part of the polyimide layer 13C not fixed to the heat radiation plate 13B is removed to expose the copper plate 13D. The exposed portion of the copper plate 13D is connected to the electrode of the LED element 2 through a solder bump or the like, and simultaneously the LED element 2 is fixed to the lower edge of the heat radiation plate 13B through an adhesive. Thus, the polyimide layer 13C also serves to insulate the LED element 2 from the heat radiation plate 13B.

In the eighth preferred embodiment described above, since the copper plate 13D as a wiring layer is integrally disposed, through the polyimide layer 13C as an insulating layer, between the two heat radiation plates 13B, the assembling performance of the heat radiation plate 13B to the case 10 can be enhanced.

Further, since the polyimide layer 13C insulates the case 10 and the heat radiation plate 13B from the copper plate 13D, no insulating material is needed in assembling the heat radiation plate 13B to the case 10. Therefore, the number of components can be reduced and the reflection-type light emitting apparatus can be formed at a lower cost.

Further, since the copper plate 13d is placed in the cross section of the heat radiation plate 13B, a desired wiring pattern can be formed according to the mounted LED package 20 or LED element 2 and therefore can have an enhanced degree of freedom in wiring without damaging the light extraction property of reflection-type light emitting apparatus.

In view of deterioration in the seal material, by sealing the light emitting element with an inorganic material, not resin, optical absorption caused by deterioration in seal material due to heat and light self-generated from the light emitting element can be suppressed to prevent a reduction in external radiation efficiency of the LED 20. In particular, since in case of GaN based LED element 2 a major factor of reduction in emission output is deterioration in seal material, the LED 20 can have very little deterioration in output by the glass sealing. Even when used for UV light with λ=365 nm, its initial transmittance and transmittance retention efficiency can be kept excellent.

With regard to refractive index: silicone resin may be used in place of epoxy resin with much resin deterioration, but the light output is reduced by 5-10% since the silicon resin has a refractive index lower than the epoxy resin. In contrast, by selecting glass as a seal material, it becomes easy to select a high refractive index, i.e., a refractive index n=1.55 or higher, as compared to that of epoxy resin.

With regard to separation and disconnection due to difference in thermal expansion coefficient: since the seal glass and the glass-containing $Al_2O_3$ board 200 are equal in thermal expansion coefficient even at room temperature or at a low temperature after being bonded together at a high temperature, a bonding failure such as separation and cracking is less likely to be generated. Further, glass has a thermal expansion coefficient of less than 1/5 and less than 1/10 as compared to epoxy resin and silicone resin, respectively, which are generally used as seal material. Therefore, disconnection due to difference in thermal expansion coefficient is much less likely to be generated. Thus, even when using a heat radiation plate with a radiation width of 3 mm in the back direction of light source section, there is generated no significant influence. However, in view of influence on long-term lifetime, it is desirable that its heat radiation property is secured by providing a radiation width five times the thickness of heat radiation plate.

Other than during the manufacturing process, a thermal stress may be generated due to heat generated from a large-current type light emitting element. However, even in such a case, an advantage is that there is no material such as resin with a thermal expansion coefficient significantly larger than other materials. Therefore, a problem such as cracking generated due to thermal stress can be avoided.

With regard to downsizing of package: since the glass-containing $Al_2O_3$ board 200 and the glass 6 are bonded in chemical bonding through oxides to obtain a sure bonding strength, a compact package with excellent bonding property can be provided even when the bonding area is small. Thereby, since a package can be obtained with a size less than three times the LED element 2, it allows reduction in blocking ratio of reflected light from the reflection mirror surface 11A. Especially, in a small reflection mirror surface of about 10ϕ, the blocking reduction effect can be enhanced. Such a package corresponds to the light source section. Further, a small package can be provided with a plurality of LED elements 2 mounted densely. In this case, the same effect can be obtained. However, in this case, it is desirable that the diameter of reflection mirror surface is increased according as the package size is increased.

In manufacturing the LED described above, a ceramic board is used with a thermal expansion coefficient nearly equal to low-melting glass. Thereby, a thermal resistance in processing can be secured, and a thermal stress due to temperature difference or thermal expansion coefficient difference between in processing and at room temperature can be suppressed to prevent cracking or the like. Further, a flip-chip type light emitting element is used that has no wire in mounting. Thereby, the LED can be manufactured in a high viscosity glass state ($10^4$ to $10^9$ poises) while having a low temperature as much as possible. This is conducted such that the light emitting element and the ceramic board are glass-sealed by hot pressing. This solves the problem that the concept of LED with glass seal is ever proposed but is not realized.

For the LED 20, a combination of glass silicate (thermal expansion coefficient=$6.5 \times 10^{-6}$/° C., Tg=500° C.) and an $Al_2O_3$ board (thermal expansion coefficient=$7.0 \times 10^{-6}$/° C.) may be used in place of a combination of phosphoric glass (thermal expansion coefficient=$11.4 \times 10^{-6}$/° C., Tg=390° C.) and a glass-containing $Al_2O_3$ board (thermal expansion coefficient=$12.3 \times 10^{-6}$/° C.). If the seal glass has a thermal expansion coefficient of about $7.0 \times 10^{-6}$/° C. which is equal to that of the LED element 2, even the large size LED element 2 can be glass-sealed.

When the seal material of LED element 2 is silicone resin, dust or dirt is likely to be attached thereto and it is difficult to remove. Therefore, the transparent plate 12 needs to be provided. However, in case of using glass as the seal material, dust or dirt is less likely to be attached thereto and it is easy to remove. Therefore, the transparent plate 12 does not need to be provided. In this case, an effect can be obtained that heat radiation from inside the case 10 and reflection mirror section 11 to the air is promoted.

The circuit section including the polyimide film need not necessarily accompany the heat radiation plate. In the case of using no heat radiation plate, the surface of polyimide film may be mirror-finished by silver plating or aluminum evaporation.

(9) Ninth Preferred Embodiment

Figure 12A:
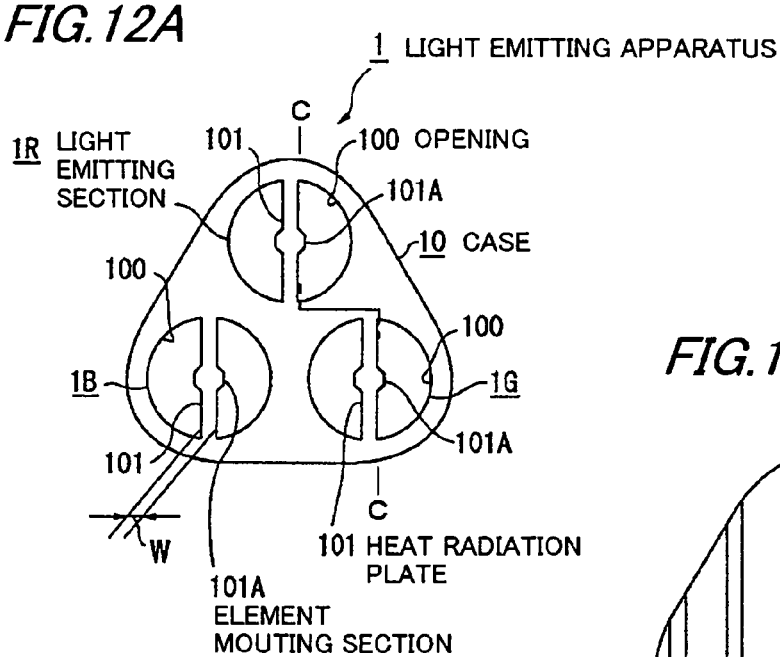
FIG. 12A is a plain view showing, viewed from a light radiation side, a reflection-type light emitting apparatus in a ninth preferred embodiment of the present invention.
Figure 12B:
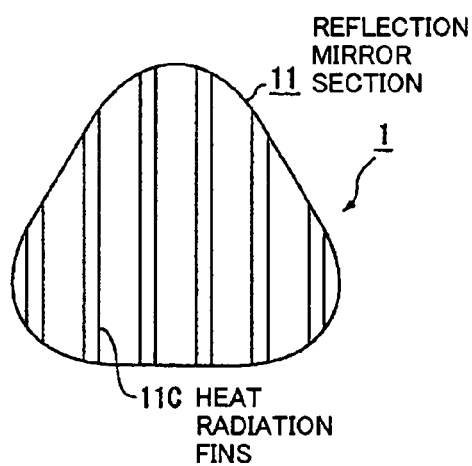
FIG. 12B is a back view showing the reflection-type light emitting apparatus in FIG. 12A.
Figure 12C:
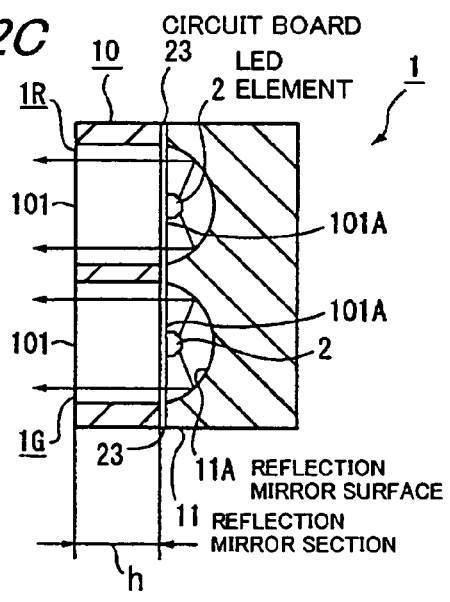
FIG. 12C is a vertical cross sectional view cut along a line C-C in FIG. 12A.
Figure 12D:
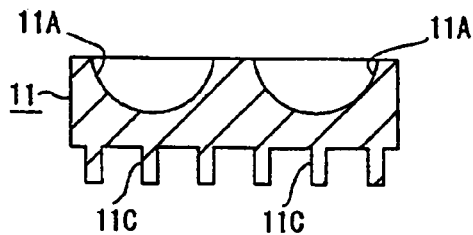
FIG. 12D is a side view showing the shape of radiator fins in FIG. 12B.

FIG. 12A is a plain view showing, viewed from a light radiation side, a reflection-type light emitting apparatus in the ninth preferred embodiment of the invention. FIG. 12B is a back view showing the reflection-type light emitting apparatus in FIG. 12A. FIG. 12C is a vertical cross sectional view cut along a line C-C in FIG. 12A. FIG. 12D is a side view showing the shape of radiator fins in FIG. 12B.

The light emitting apparatus 1 has light emitting sections 1R, 1G and 1B that are integrally placed in the case 10 of copper and in nearly triangle form and emit red light (R), green light (G) and blue light (B), respectively, and it is integrated with the reflection mirror section 11.

The reflection mirror section 11 has three reflection mirror surfaces 11A that reflect R, G and B lights radiated from the three LED elements 2, and radiation fins 11C formed on the opposite side to the reflection mirror surfaces 11A.

The LED elements 2 are a UV LED element that radiates UV light, and are sealed with phosphor-containing silicone resin explained later.

The case 10 is formed by stamping a copper plate, Ag-plated on the surface to enhance the light reflectivity property, and overcoated with a transparent resin material on the top surface. Further, it has: three openings 100 for extracting reflected light from the reflection mirror surface 11A of the reflection mirror section 11; and heat radiation plates 101 that have a radiation width in the back direction of the LED element 2 so as to radiate heat generated from the LED element 2 with little blocking reflected light from the reflection mirror surface 11A of the reflection mirror section 11. The heat radiation plate 101 has at the center an element mounting section 101A on which the LED element 2 is mounted, and has a circuit board 23 to supply power to the LED element 2. The heat radiation plate 101 is integrated with the case 10 so as to efficiently transfer heat generated by the turn-on of LED element 2. It has a width of W:1 mm and a width of h:7.5 mm in the back direction of the light source section including the LED element 2.

The reflection mirror section 11 is like the case 10 of copper and Ag-plated on the surface. It is structured such that light radiated from the LED element 2 is reflected on the semispherical reflection mirror surface 11A positioned corresponding to the opening 100 of the case 10 so as to take out the light in the opposite direction to the emission direction of LED element 2. Further, it has the radiation fins 11C formed linearly with a predetermined height and a predetermined interval on the opposite side to its face bonded to the case 10. The radiation fin 11C may be, other than the form as shown, for example, formed in a zigzag and further may be roughened to increase the surface area.

Figure 13A:
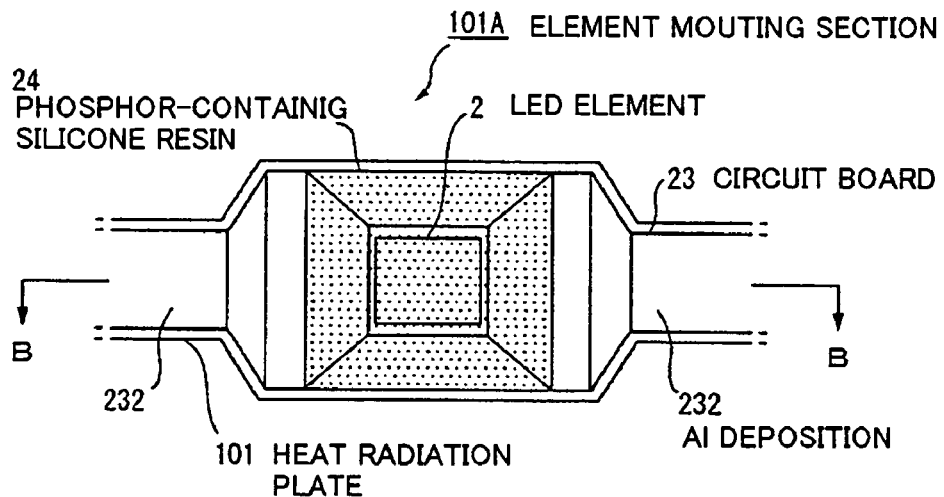
FIG. 13A is a plain view showing, viewed from a light radiation side, a heat radiation section and an element mounting section.
Figure 13B:
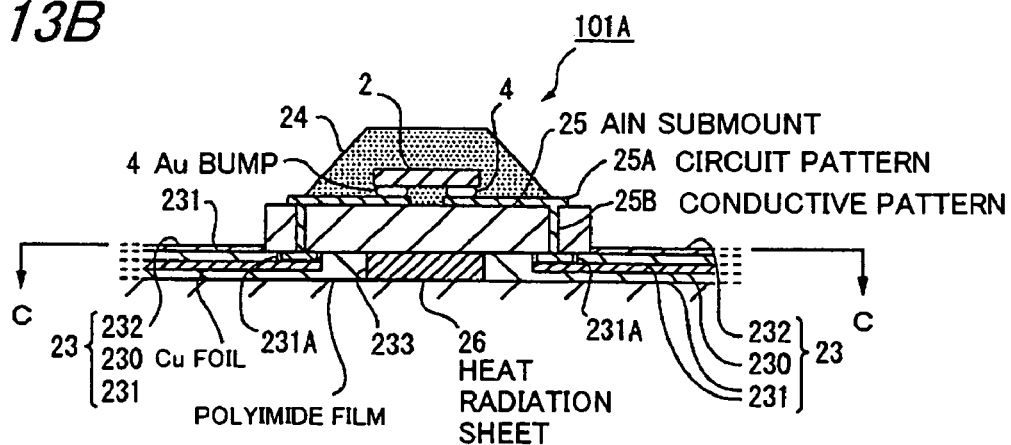
FIG. 13B is a cross sectional view cut along a line B-B in FIG. 13A.
Figure 13C:
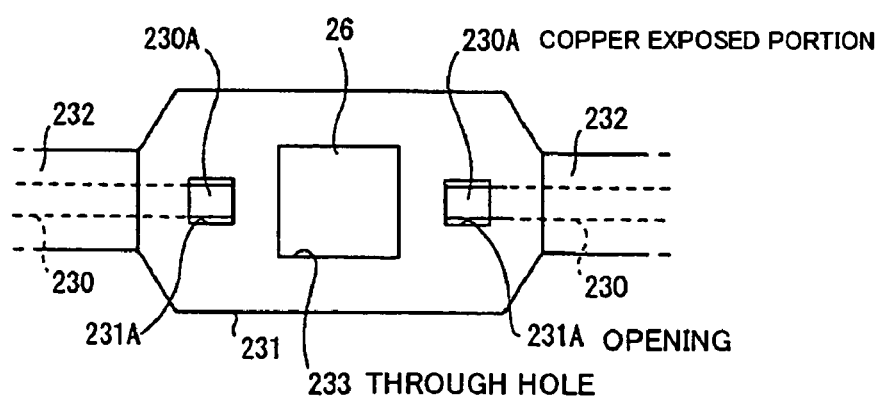
FIG. 13C is a cross sectional view cut along a line C-C in FIG. 13B.

FIG. 13A is a partial plain view showing, viewed from a light radiation side, the heat radiation section and the element mounting section. FIG. 13B is a cross sectional view cut along a line B-B in FIG. 13A. FIG. 13C is a cross sectional view cut along a line C-C in FIG. 13B.

The heat radiation plate 101 is, as shown in FIG. 13A, provided with the thin-film circuit board 23 bonded by adhesive thereon and with the LED element 2 mounted through an AlN submount 25 on the element mounting section 101A. The LED element 2 is sealed with phosphor-containing silicone resin 24. Further, at the bottom of AlN submount 25, a heat radiation sheet 26 with adhesive force and of good heat conductive material is disposed to help the heat radiation to the heat radiation plate 101. Instead of the heat radiation sheet 26, another adhesive material such as Ag paste and solder may be used that helps the heat radiation.

The circuit board 23 is, as shown in FIG. 13B, provided with a copper foil 230 as conductive layer, a polyimide layer 231 formed on the copper layer 230, and Al deposition 232 as light reflection film formed on the polyimide layer 231.

The phosphor-containing silicone resin 24 contains RGB phosphors that are excited by UV light radiated from the LED element 2. In this embodiment, at a predetermined quantity with the silicone resin, a phosphor to radiate R excited light is mixed for the light emitting section 1R, a phosphor to radiate G excited light is mixed for the light emitting section 1G, and a phosphor to radiate B excited light is mixed for the light emitting section 1B. Therefore, white light can be obtained based on light's three primary colors by simultaneously radiating lights from the light emission sections 1R, 1G and 1B.

The AlN submount 25 is composed such that circuit patterns 25A of W—Ni—Au formed on the LED element 2 mounting surface and on the surface for being mounted on the circuit board 23 are electrically connected through a conductive pattern 25B.

The circuit board 23 is, as shown in FIG. 13C, provided with openings 231A that are formed corresponding to the circuit pattern 25A so as to secure the electrical connection with the AlN submount 25. A copper foil exposed portion 230A exposed in the opening 231A is electrically connected through solder etc. to the circuit pattern 25A formed at the bottom of the AlN submount 25. The heat radiation sheet 26 attached to the bottom of AlN submount 25 is in surface contact with the heat radiation plate 101 through a through-hole 233.

In the ninth embodiment, the multiple light emitting sections 1R, 1G and 1B are integrally placed in the case 10, and R, G and B lights are externally radiated through the reflection of reflection mirror surface 11A from the light emitting sections 1R, 1G and 1B. Thus, since the multiple cellular light emitting sections are arranged in planar form on the same plane, the full-color type light emitting apparatus can be obtained in low profile, i.e., with an excellent design, and with high output.

Halogen bulbs lower than 10 W are difficult to embody in technical aspect since they do not have sufficient halogen cycle even when the commercialization thereof is needed. However, as above explained in the ninth embodiment, the small LED spot light source in several W class can be embodied with an excellent integration performance by arranging densely the cellular multiple light emitting sections in parallel. Furthermore, since light radiated from the LED light source does not contain heat ray, it has a property that an irradiated object such as chocolate and lipstick does not melt even when it is closely illuminated thereby. The light emitting section may be arranged in spherical form other than in planar form.

Since R, G and B lights are externally radiated, through the reflection of reflection mirror surface 11A, from the light emitting sections 1R, 1G and 1B placed closely in the case 10, the R, G and B lights can be irradiated to a nearly identical region at a plane distant several tens of centimeters therefrom. Thereby, the mixing property of three color lights can be enhanced and the illumination can be made with excellent color rendering property. Furthermore, by controlling the current supplied to the LED element 2 with the light emitting sections 1R, 1G and 1B, a desired color can be radiated with high brightness. Also, the color expression range can be expanded.

In a light emitting apparatus that white light is obtained from yellow light and blue light in complementary color relation, ring-like color separation is generated in its focused light since, when using a focusing optical system with lens, a difference in collecting power is generated by a refractive-index difference according to its emission wavelength difference. However, in the invention, such a color separation does not occur. Therefore, it is suitable for illumination use that a precise color rendering is needed.

Since the heat radiation plate 101 is integrally formed by punching the case 10, heat conduction from the heat radiation plate 101 to the case 10 can be more excellent than a structure with the plate fitted thereinto. Also, it can have an excellent mass-production property.

Further, since the radiation fins 11A are integrated with the reflection mirror section 11, heat transferred to the case 10 increases through the heat radiation plate 101 integrated with the case. This heat is transferred to the radiation fins 11, and therefore the heat radiation performance into the air can be enhanced for heat generated by the turn-on of LED element 2. Therefore, even when the amount of heat generated increases along with an increase in number of LED elements 2, no failure in heat radiation occurs. Even in the long-hour operation of LED element 2, no reduction in emission property is caused by heat.

Since the case 10 and the reflection mirror section 11 are made of metallic material, the light emitting apparatus 1 can be obtained with an excellent mechanical strength. Especially, since the heat radiation plate 101 is integrated with the case 10, the mechanical strength of opening 100 can be secured and, therefore, deterioration in the light radiation property is not likely to occur due to its crush or deformation. Further, since the LED element 2 is not exposed on the surface of light emitting apparatus 1, its structure is less likely to break due to external force or mechanical shock.

Since the LED element 2 is in electrical connection mounted on the thin-film circuit board 23 composed of the polyimide film 231 and copper foil 230, simple wiring structure can be obtained and thereby the light emitting apparatus 1 can be low-profiled, downsized and can be made with enhanced productivity. Since the aluminum deposition 232 provided on the surface of polyimide film 231 allows light irradiated onto the circuit board 23 to be reflected thereon toward the reflection mirror surface 11A, the optical loss can be suppressed.

Further, since the through-hole 233 is provided in the circuit board 23, the heat radiation path can be formed from the AlN submount to the heat radiation plate 101, and heat generated by the turn-on of LED element 2 can be rapidly radiated through the path including the heat radiation sheet 26, without being blocked by the polyimide film 231 with large thermal resistance.

Although in the ninth embodiment the light emitting apparatus 1 is composed of the UV LED element 2, and light emitting sections 1R, 1G and 1B using RGB phosphors, the white light emitting sections 1R, 1G and 1B may be composed using a blue LED element 2 and a phosphor to radiate yellow excited light. In this case, the phosphor can be cerium-doped YAG (yttrium aluminum garnet). Alternatively, in case of using the blue LED element 2, white light may be obtained by using red and green phosphors to radiate red light and green light when excited by blue light.

Also, without using any phosphors, the light emitting apparatus 1 for full-color illumination may be composed by R, G and B LED elements 2 closely arranged to radiate light through the reflection of reflection mirror surface 11A.

Further, the other components can be modified. For example, the case 10 may be formed of a molded material of copper. The LED element 2 is not limited to the flip-flop mount type and may be of face-up type. Further, the glass seal type LED 20 in the eighth embodiment may be mounted on the circuit board 23. In this case, the full-color light emitting apparatus 1 can be obtained with excellent reliability during long hours.

Figure 14A:
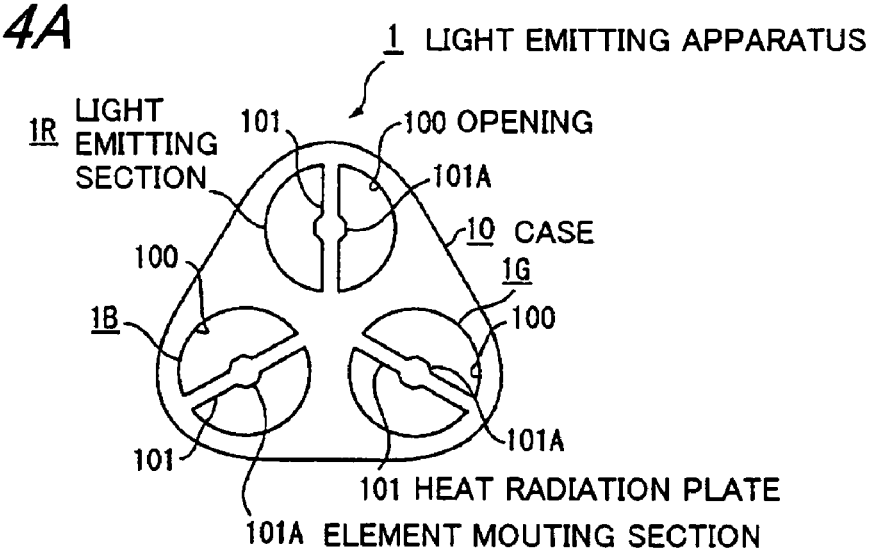
FIG. 14A is a plain view showing a modification of the heat radiation section in the ninth embodiment.
Figure 14B:
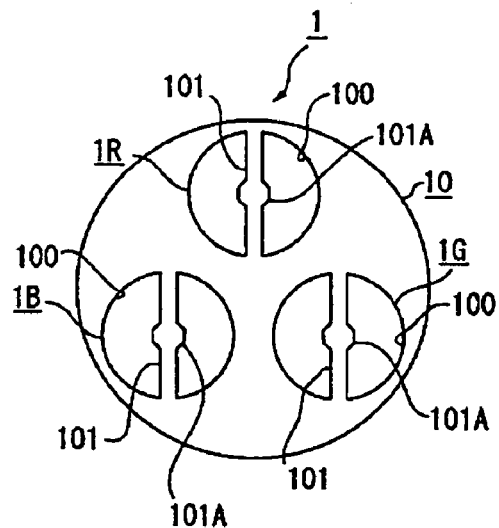
FIG. 14B is a plain view showing a modification of a case in the ninth embodiment.
Figure 14C:
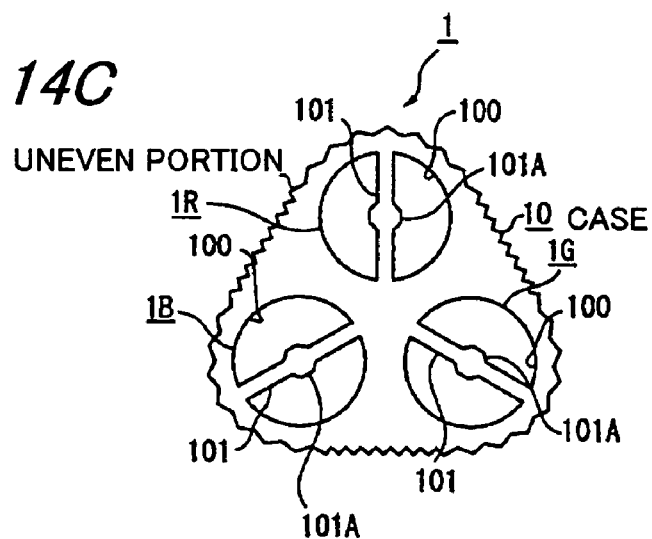
FIG. 14C is a plain view showing a further modification of the case with an uneven surface.

FIG. 14A is a plain view showing a modification of the heat radiation section in the ninth embodiment. FIG. 14B is a plain view showing a modification of the case in the ninth embodiment. FIG. 14C is a plain view showing a further modification of the case with an uneven surface.

In FIG. 14A, the heat radiation plate 101 is formed radially from the center of the case 10 in nearly triangle form. Thereby, the design property of case 10 can be enhanced.

In FIG. 14B, the case 10 is formed circular and is made by extrusion of copper alloy. Since it is formed circular, the light emitting apparatus 1 can have a shape compatibility with existing lamp and socket etc.

In FIG. 14C, the case 10 in nearly triangle form is an uneven portion 10C formed on the surface thereof. Thereby, the surface area can be increased to enhance the heat radiation property. The same effect can be obtained by roughening the outer surface of case 10 by blasting etc., instead of forming the uneven portion 10C. Alternatively, the uneven surface and the surface roughening may be used together.

(10) Tenth Preferred Embodiment

FIG. 15 is a plain view showing a reflection-type light emitting apparatus in the tenth preferred embodiment of the invention.

The light emitting apparatus 1 has a hexagonal case 10 with seven light emitting sections that a light emitting section 1B is placed at the center and two light emitting sections 1G and four light emitting sections 1R are placed around the section 1B. Since the multiple light emitting sections are closely disposed, the full light emitting apparatus 1 can be obtained with high brightness, downsized shape and excellent integration performance. In case of providing the light emitting apparatus 1 with multiple LED elements 2, the uneven surface or the surface roughening is preferably formed so as to enhance the heat radiation property.

(11) Eleventh Preferred Embodiment

Figure 16A:
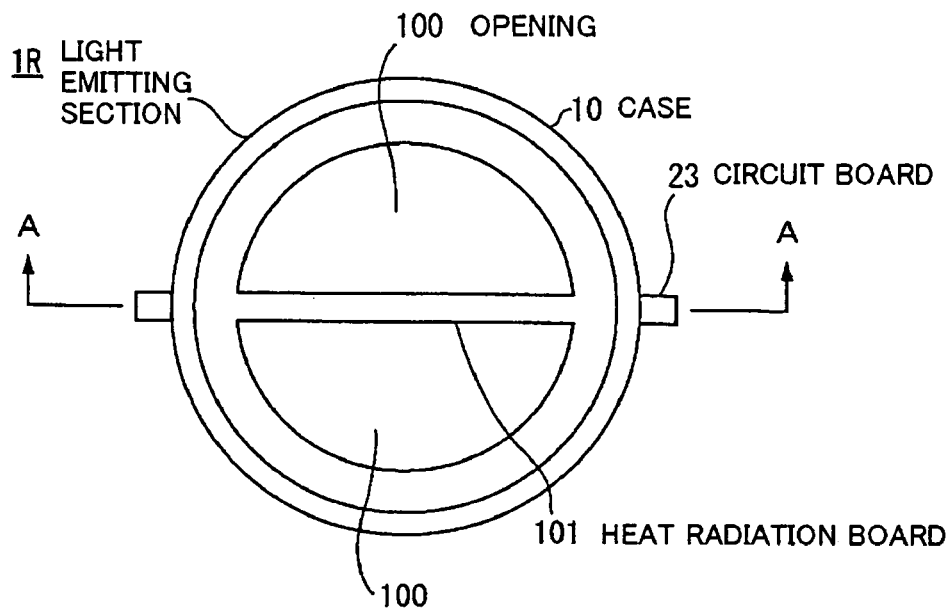
FIG. 16A is a plain view showing a light emitting section of a reflection-type light emitting apparatus in an eleventh preferred embodiment of the present invention.
Figure 16B:
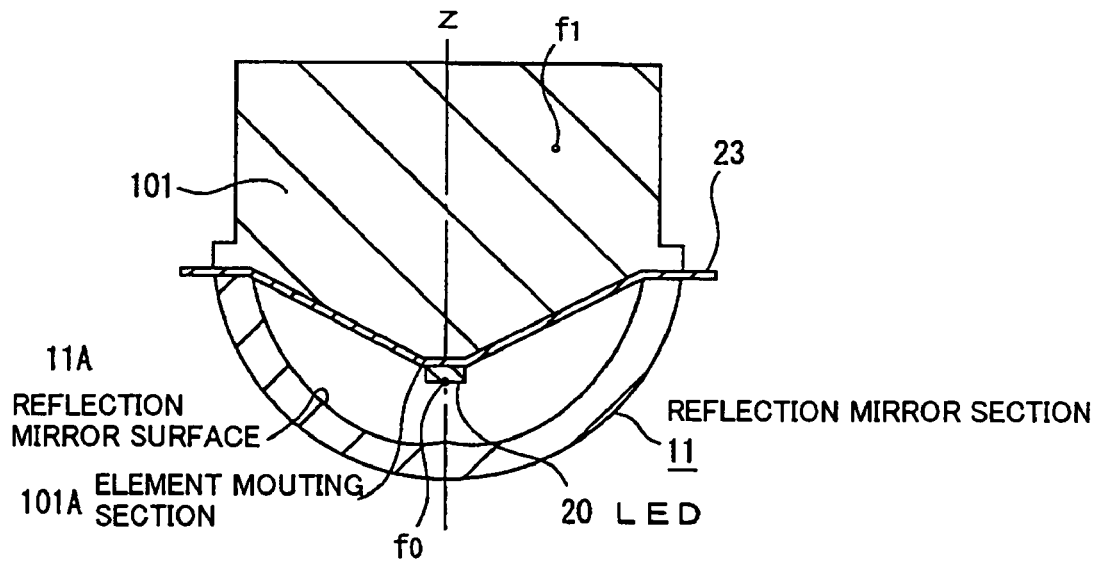
FIG. 16B is a cross sectional view cut along a line A-A in FIG. 16A.

FIG. 16A is a plain view showing a light emitting section of a reflection-type light emitting apparatus in the eleventh preferred embodiment of the present invention. FIG. 16B is a cross sectional view cut along a line A-A in FIG. 16A.

The light emitting section 1R is composed of a heat radiation plate 101 that is integrated with the case 10 and is formed in a shape not to block light radiated from LED 20, and a reflection mirror section 11 with a reflection mirror surface 11A that light radiated from the LED 20 is efficiently reflected thereon. Although only the light emitting section 1R is shown in FIGS. 16A and 16B, the light emitting sections 1G, 1B as shown in FIG. 12 may be formed in like manner.

The heat radiation plate 101 is in nearly pentagonal form that an element mounting portion 101A is formed protruding toward the bottom of the reflection mirror surface 11A, and the LED 20 as explained referring to FIG. 10 is mounted on the element mounting portion 101A located at the corner with oblique lines. In this embodiment, the LED 20 has a blue LED element 2 with YAG phosphors coated like a thin film on the surface thereof. Thereby, the wavelength conversion type LED is obtained that radiates white light with wide light distribution.

The reflection mirror section 11 is formed by injection molding of resin material and has curved surfaces on which Al deposition film is formed to shape the reflection mirror section 11A. The reflection mirror surface 11A is formed by rotating around the Z-axis an elliptic curve (with focal points $f_0$, $f_1$), and is in the range of 0 to 115 degrees to the Z-axis of LED 20 mounted on the element mounting portion 101A of heat radiation plate 101 and has a solid angle of 2.85 πstrad to the LED 20. According to the light distribution of light source, it has desirably a solid angle of 2π to 3.4 πstrad in the range of 0 to 90 or 120 degrees to the Z-axis so as to have high efficiency radiation.

In the eleventh embodiment, the LED 20 is disposed on the element mounting portion 101A protruding toward into the reflection mirror section 11, and the reflection mirror section 11 has the reflection mirror surface 11A formed according to the position of LED 20. Therefore, the radiation area of heat radiation plate 101 can be increased to enhance the heat radiation performance. Further, since the solid angle of reflection mirror surface is increased by the disposition of LED 20 and reflection mirror surface 11A, most of light radiated with wide light distribution from the LED 20 can be reflected on the reflection mirror surface 11A and efficiently radiated without being blocked by the heat radiation plate 101. Therefore, this embodiment is especially suitable to LED with phosphor and wide light distribution. Further, with multiple cellular light emitting sections disposed integrally, a higher brightness can be obtained.

Although in the eleventh embodiment the LED 20 is mounted on the circuit board 23, an LED element 2 may be mounted thereon.

INDUSTRIAL APPLICABILITY

In the light emitting apparatus of the present invention, the heat radiation plate with a heat radiation width is disposed in the back direction of light emitting element and the reflection section is disposed opposite to the light emitting surface of light emitting element to reflect and externally radiate light emitted from the light emitting element. Therefore, the light emitting apparatus can have an excellent heat radiation property in using a high power light emitting element so that it can radiate light with high intensity at high efficiency.

Further, in the light emitting element of the present invention, the heat radiation section with a heat radiation width is disposed in the back direction of light emitting element and is placed in the case with a heat radiation property, and the reflection section is disposed opposite to the light emitting surface of light emitting element to reflect and externally radiate light emitted from the light emitting element. Therefore, the light emitting apparatus can have an excellent heat radiation property and can minimize a reduction in emission efficiency of reflected light.

Further, in the light emitting apparatus of the present invention, the power supply section for supplying power to the light emitting element is formed as a metallic thin film instead of a lead, and inserted in between two heat radiation plates. Therefore, the number of components for the apparatus can be reduced, the assembling becomes easy, and the manufacturing cost can be reduced.

What is claimed is:

1. A light emitting apparatus, comprising:
   a solid-state light emitting element;
   a power supply member that supplies power to the solid-state light emitting element;
   a reflection section that is disposed opposite to a light extraction surface of the solid-state light emitting element to reflect light emitted from the solid-state light emitting element
   a heat radiation member that is disposed with a heat radiation width in a back direction of the solid-state light emitting element;
   an insulating layer disposed between the power supply member and the heat radiation member; and
   a case in which the reflection section and the heat radiation member are placed and which externally radiates heat to be transferred from the heat radiation member,
   wherein the case is integrated with the heat radiation member, the case comprises an inner wall surface with a high reflectivity, and the case has a high heat conductivity, and
   wherein the heat radiation member comprises a planar member disposed parallel to a light extraction direction of the light emitting apparatus,
   the power supply member, which is separate from said heat radiation member, is secured to an end face of the planar member,
   the solid-state light emitting element is mounted on the end face of the planar member, and
   the planar member is disposed parallel to a longitudinal direction of the power supply member, wherein the power supply member and the planar member both comprise a light reflective surface.

2. The light emitting apparatus according to claim 1, wherein:
   the solid-state light emitting element is packaged such that the solid-state light emitting element is sealed with a light transmitting material.

3. The light emitting apparatus according to claim 1, wherein:
   the solid-state light emitting element is flip-chip mounted on an inorganic material board on which a conductive pattern is formed to supply power to the solid-state light emitting element, and
   the solid-state light emitting element is sealed with an inorganic seal material that has a thermal expansion coefficient nearly equal to that of the inorganic material board.

4. The light emitting apparatus according to claim 3, wherein:
   the inorganic seal material comprises glass.

5. The light emitting apparatus according to claim 3, wherein:
   the inorganic material board seals the solid state light emitting element while bonding in chemical reaction to the inorganic seal material.

6. The light emitting apparatus according to claim 1, wherein:
   the solid-state light emitting element is sealed with the inorganic seal material with a refractive index of 1.55 or more.

7. The light emitting apparatus according claim 1, wherein:
the heat radiation member comprises a heat radiation plate that comprises a high reflectivity surface to reflect the light.

8. The light emitting apparatus according to claim 1, wherein:
the heat radiation member comprises:
a heat radiation support that comprises a high thermal conductivity material and transfers to the heat radiation member heat generated from the solid-state light emitting element, and
a heat radiation plate that transfers the heat through the heat radiation support.

9. A light emitting apparatus, comprising:
a solid-state light emitting element;
a power supply member that supplies power to the solid-state light emitting element;
a reflection section that is disposed opposite to a light extraction surface of the solid-state light emitting element to reflect light emitted from the solid-state light emitting element;
a heat radiation member that is disposed with a heat radiation width in a back direction of the solid-state light emitting element;
an insulating layer disposed between the power supply member and the heat radiation member; and
a case in which the reflection section and the heat radiation member are placed and which externally radiates heat to be transferred from the heat radiation member,
wherein the case is integrated with the heat radiation member, the case comprises an inner wall surface with a high reflectivity, and the case has a high heat conductivity, and
wherein the power supply member is formed with a width in the back direction of the solid-state light emitting element,
the heat radiation member comprises a planar member disposed parallel to a light extraction direction of the light emitting apparatus,
the power supply member, which is separate from said heat radiation member, is secured to an end face of the planar member,
the solid-state light emitting element is mounted on the end face of the planar member, and
the planar member is disposed parallel to a longitudinal direction of the power supply member, wherein the power supply member and the planar member both comprise a light reflective surface.

10. The light emitting apparatus according to claim 1, wherein:
the power supply member comprises a metallic thin film and is disposed with a width in the back direction of the solid-state light emitting element and is integrated with the heat radiation member while being insulated from the heat radiation member.

11. The light emitting apparatus according to claim 10, wherein:
the power supply member comprises a metallic thin film and is sandwiched through an insulator between a plurality of heat radiation plates to compose the heat radiation member.

12. The light emitting apparatus according to claim 1, wherein:
a spectrum light with plurality of region wavelengths is radiated from the solid-state light emitting element or from the periphery of the solid-state light emitting element.

13. The light emitting apparatus according to claim 12, wherein:
a phosphor is disposed on the periphery of the solid-state light emitting element.

14. The light emitting apparatus according to claim 1, wherein:
the heat radiation member has the heat radiation width that is three times or more its thickness.

15. The light emitting apparatus according to claim 1, wherein:
the solid-state light emitting element has a width that is within five times that of the solid-state light emitting element.

16. The light emitting apparatus according to claim 1, wherein:
the heat radiation member comprises a shape that protrudes toward a bottom of the reflection surface.

17. The light emitting apparatus according to claim 1, wherein:
the reflection surface opposite to the solid-state light emitting element comprises a solid angle of $2\pi$ it to $3.4\pi$ strad.

18. The light emitting apparatus according to claim 1, wherein:
the solid-state light emitting element comprises a light source with a turn-on power of 1 W or more.

19. The light emitting apparatus according to claim 1, wherein:
the reflection section comprises a resin material.

20. The light emitting apparatus according to claim 1, wherein:
the solid-state light emitting element comprises one of a plurality of solid-state light emitting elements.

21. The light emitting apparatus according to claim 1, wherein the light emitting apparatus further comprises:
a plurality of solid-state light emitting elements and
a plurality of heat radiation members, the heat radiation members corresponding to the plurality of solid-state light emitting elements.

22. The light emitting apparatus according to claim 1, wherein:
the plurality of solid-state light emitting elements generate a plurality of emission colors.

23. The light emitting apparatus according to claim 22, wherein:
the plurality of solid-state light emitting elements generate emission colors of R, G and B.

24. A light emitting apparatus, comprising:
a solid-state light emitting element;
a power supply member that supplies power to the solid-state light emitting element
a reflection section that is disposed opposite to a light extraction surface of the solid-state light emitting element to reflect light emitted from the solid-state light emitting element; and
a heat radiation member that is disposed with a heat radiation width in a back direction of the solid-state light emitting element; and
a case in which the reflection section and the heat radiation member are placed and which external radiates heat to be transferred from the heat radiation member,
wherein the case is integrated with the heat radiation member, the case comprises an inner wall surface with a high reflectivity, and the case has a high heat conductivity, and
wherein the heat radiation member is separated from the power supply member, the heat radiation member comprises a planar member disposed parallel to a light extraction direction of the light emitting apparatus, the power supply member, which is separate from said heat radiation member, is secured to an end face of the planar member, the solid-state light emitting element is mounted on the end face of the planar member, and the planar member is disposed parallel to a longitudinal direction of the power supply member, wherein the power supply member and the planar member both comprise a light reflective surface.

25. The light emitting apparatus according to claim 1, wherein the power supply member is insulated from the heat radiation member by the insulation layer.

26. The light emitting apparatus according to claim 1, wherein said heat radiation member further comprises a second planar member disposed perpendicular to and intersecting said planar member.

27. The light emitting apparatus according to claim 1, wherein said planar member comprises a front surface, a rear surface, and said end face, a surface area of said end face is smaller than a surface area of said front surface and the surface area of said end face is smaller than a surface area of said rear surface.

28. The light emitting apparatus according to claim 1, wherein said planar member has a width and thickness, the thickness corresponding to said end face, and wherein the width of the planar member is larger than a thickness of the end face.

29. The light emitting apparatus according to claim 1, wherein the power supply member comprises a lead and the planar member is disposed parallel to a longitudinal direction of the lead.

* * * * *